(12) United States Patent
Sassler et al.

(10) Patent No.: US 9,941,862 B2
(45) Date of Patent: Apr. 10, 2018

(54) FILTER THAT MINIMIZES IN-BAND NOISE AND MAXIMIZES DETECTION SENSITIVITY OF EXPONENTIALLY-MODULATED SIGNALS

(71) Applicant: DYNASPOT CORP., Wayne, NJ (US)

(72) Inventors: Marvin L. Sassler, Wayne, NJ (US); Alan T. Sassler, Las Vegas, NV (US)

(73) Assignee: DYNASPOT CORP., Wayne, NJ (US)

(*) Notice: Subject to any disclaimer, the term of this patent is extended or adjusted under 35 U.S.C. 154(b) by 0 days.

(21) Appl. No.: 15/127,472

(22) PCT Filed: Mar. 20, 2015

(86) PCT No.: PCT/US2015/021675
§ 371 (c)(1),
(2) Date: Sep. 20, 2016

(87) PCT Pub. No.: WO2015/143274
PCT Pub. Date: Sep. 24, 2015

(65) Prior Publication Data
US 2017/0141761 A1   May 18, 2017

Related U.S. Application Data

(60) Provisional application No. 61/968,453, filed on Mar. 21, 2014.

(51) Int. Cl.
*H04L 27/06* (2006.01)
*H03H 17/02* (2006.01)
*H04B 1/16* (2006.01)

(52) U.S. Cl.
CPC .......... *H03H 17/0248* (2013.01); *H04B 1/16* (2013.01)

(58) Field of Classification Search
CPC ........................................................ H04B 1/16
(Continued)

(56) References Cited

U.S. PATENT DOCUMENTS 3,525,946 A * 8/1970 Grace ..................... H03D 3/04
329/327
3,876,939 A * 4/1975 Lerner .................... H03D 3/24
455/208

(Continued)

OTHER PUBLICATIONS

International Search Report for PCT/US2015/021675, dated Jun. 22, 2015.

(Continued)

*Primary Examiner* — Lihong Yu
(74) *Attorney, Agent, or Firm* — Caesar Rivise, PC

(57) ABSTRACT

The trans-filter compresses in band AWGN, demodulates input signals and has no threshold due to applied noise. Two frequency selective networks with opposite amplitude vs frequency slopes are designed to remain 180 degrees out of phase over the signal band. Output amplitudes are equal at band center and are summed producing a monotonic amplitude vs frequency characteristic going thru zero at center frequency with abrupt phase reversal. This produces the parabolic output noise density and differentiates applied signals. Absence of nonlinear circuit components and product devices prevents generation of noisexnoise products, avoiding the threshold phenomenon. Exponentially modulated digital signals produce output impulses due to the slope and abrupt phase reversal. The impulses have strong fundamental frequency components and may be recovered at baseband without frequency conversion. Cascading trans-filters increases noise reduction and impulse amplitude. The trans-filter algorithm may be used separately or in conjunction with one or more hardware trans-filters.

9 Claims, 30 Drawing Sheets

(58) Field of Classification Search
USPC .......................................................... 375/340
See application file for complete search history.

(56) References Cited

U.S. PATENT DOCUMENTS

| | | |
|---|---|---|
| 6,002,298 A | 12/1999 | Noga |
| 2005/0001761 A1 | 1/2005 | Kliewer et al. |
| 2006/0274641 A1 | 12/2006 | Grieco et al. |
| 2011/0106541 A1 | 5/2011 | Ekstrand et al. |

OTHER PUBLICATIONS

Yaqin Zhao, et al., "A Modified Modulation Recognition Method against . . . ", Information Technology Journal, vol. 10, Issue 4, pp. 825-832, 2011.

\* cited by examiner

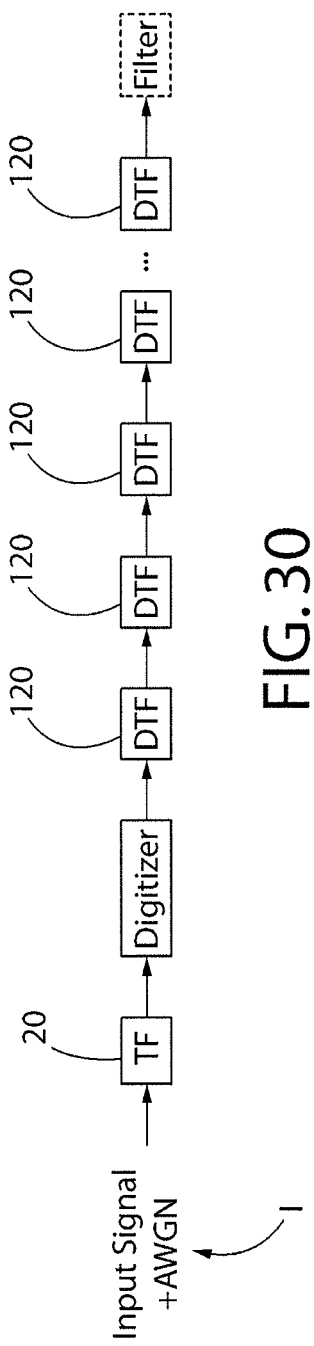

FILTER THAT MINIMIZES IN-BAND NOISE AND MAXIMIZES DETECTION SENSITIVITY OF EXPONENTIALLY-MODULATED SIGNALS

CROSS-REFERENCE TO RELATED APPLICATIONS

This U.S. national phase application claims the benefit under 35 U.S.C. § 371 of PCT Application No. PCT/US2015/021675 filed on Mar. 20, 2015, which in turn claims the benefit under 35 U.S.C. § 119(e) of Provisional Application Ser. No. 61/968,453 filed on Mar. 21, 2014 entitled TRANS FILTER and all of whose entire disclosures are incorporated by reference herein.

BACKGROUND OF THE INVENTION

The present invention relates generally to devices that recover, detect or demodulate signals, and more particularly, to devices that provider greater sensitivity and noise rejection for the detection of FM Doppler radar, geological or oceanographic sonar returns and for spread spectrum communication or hybrid envelope/exponent modulation systems.

Conventional FM detectors/demodulators suffer from a threshold phenomenon which limits detection sensitivity of exponentially modulated signals (also referred to as "angle modulated signals"). These detectors/demodulators typically utilize diode rectifiers and matched filters to recover the baseband information signals. However, such devices introduce non-linearities, e.g., noise cross products, that are the root cause of the threshold phenomenon.

As predicted by Claude Shannon, an FM demodulator is 1.77 dB more sensitive than a matched filter of equal bandwidth. Under this paradigm, the best that can be achieved by using the matched filter is an output signal-to-noise ratio (SNR) that is equal to the input carrier-to-noise ratio (CNR).

In particular, the current state-of-the-art in analog demodulators or detectors of exponentially modulated signals can be categorized into several broad classes. The first major class distinction considers the treatment of additive white Gaussian noise (AWGN). There are methods that convert or transform stationary AWGN to a parabolic noise density distribution and those that do not. Those that do convert AWGN to a parabolic distribution all have a CNR threshold limitation below which the conversion ceases. Foster-Seely, Travis and Ratio Detector types of exponential modulation demodulators, detectors or discriminators are the primary types that perform the conversion when operating at (C/KT) above the threshold limitation. See FIGS. 1A and 1B which depict a Travis FM discriminator and a Foster-Seeley discriminator, respectively.

Another general class of exponential modulation detectors utilize some form of product detection. This class of detectors do not convert AWGN to a parabolic noise power distribution. At best, they do not degrade the output detected signal-to-noise-ratio to a value worse than the input (CNR) or (C/KTB) where the input and output bands are equal. Among this type of detector are the Phase Locked Loop, the correlation detector. The Phase Locked Loop uses a voltage controlled oscillator (VCO) to provide a replica of the received signal. The phase error between the received signal and the VCO provides the signal that drives the VCO. It can have a threshold that is about 3 dB better that of the Foster-Seeley or Travis Demodulator. Other types of exponential modulation detectors are:

1. Pulse Counting Discriminator. This method uses a monostable multivibrator or other pulse generator that produces a pulse of constant amplitude and width each time the composite noise and signal voltage crosses a reference value. The output pulses are low pass filtered to reject the pulse repetition rate. Fluctuation of the average value of the LP Filter output is the baseband information. This type of demodulator has a high threshold and is seldom used.
2. The FMFB utilizes negative feed-back to compress the received spectrum prior to demodulation. This technique is effective for small information bandwidths and has been used to carry up to 600 telephone channels on a single FDMFM carrier. The threshold improvement is of the order of 3 dB.
3. I/Q Demodulators. This class of demodulator requires a high degree of synchronization with the transmitted signal. The received signal is broken down into In Phase and Quadrature components. The multipliers or mixers used to perform the conversion do not transform flat input noise density to parabolic and so are limited to matched filter performance. However, there is no threshold if the band can be made small enough. Using this type of detector with a 1 Hz bandwidth the signal and noise can be sampled and stored. Multiple samples can be processed to effectively decrease the bandwidth and increase (SNR). This technique is used to detect weak Doppler RADAR returns.

Therefore, in view of the foregoing, all of these conventional demodulators fail to address the CNR threshold and, as a result, at or below this threshold the output signal is pure noise. Furthermore, because these configurations are demodulators, they do not operate as filters and consequently these demodulators cannot be cascaded.

Thus, there remains a need to overcome this threshold phenomenon by using filtering techniques which permit the cascading of stages thereof, that improves the SNR and which eliminates the need to utilize complex techniques to result in improved performance and design simplification.

All references cited herein are incorporated herein by reference in their entireties.

BRIEF SUMMARY OF THE INVENTION

A filter that demodulates an exponentially modulated signal and compresses noise in its signal band is disclosed. The filter comprises: a first frequency selective network using only linear components and which forms a frequency domain derivative operator that generates an output that is a function of a rate of change of a carrier frequency of the exponentially modulated signal at an input to said filter, wherein the linear components minimize a threshold (e.g., CNR threshold) that is normally present in exponentially modulated signal demodulators; and wherein the first frequency selective network is operative on any modulation format of the exponentially modulated signal and generates impulses for abrupt changes in the carrier frequency corresponding to data transitions that form the baseband of the exponentially modulated signal while compressing noise in the signal band.

An additional embodiment comprises having a cascade of more than one of these filters that further compresses the signal band noise while increasing the amplitude of the impulses.

A method for demodulating an exponentially modulated signal and compressing noise in its signal band is disclosed. The method comprises: feeding the exponentially modulated signal into a first frequency selective network that uses only linear components for minimizing a threshold (e.g., CNR threshold) that is normally present in exponentially modulated signal demodulators; obtaining a frequency domain derivative of the exponentially modulated signal that generates an output which is a function of a rate of change of a carrier frequency of the exponentially modulated signal, independent of a modulation format used in the exponentially modulated signal; generating impulses for abrupt changes in the carrier frequency corresponding to data transitions that form the baseband of the exponentially modulated signal; and compressing noise in the signal band.

An additional step comprises cascading more than one of these filters together to further compress the in-band noise while increasing the amplitude of the impulses.

BRIEF DESCRIPTION OF SEVERAL VIEWS OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 30 is a block diagram showing a plurality of digital trans-filters being cascaded, including the use of the first embodiment of the trans-filter being used as a noise compressor before the input signal is converted to a digital signal.

DETAILED DESCRIPTION OF THE PREFERRED EMBODIMENTS

Figure 1A:
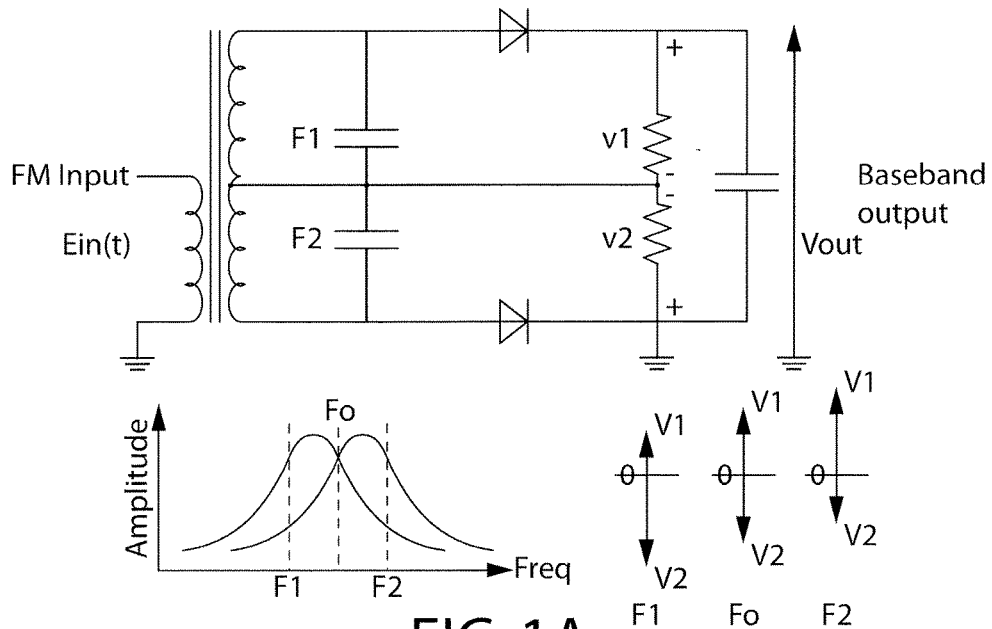
FIG. 1A is a prior art demodulator, viz., Travis FM discriminator along with its frequency and signal characteristics, that operates above the CNR threshold.
Figure 1B:
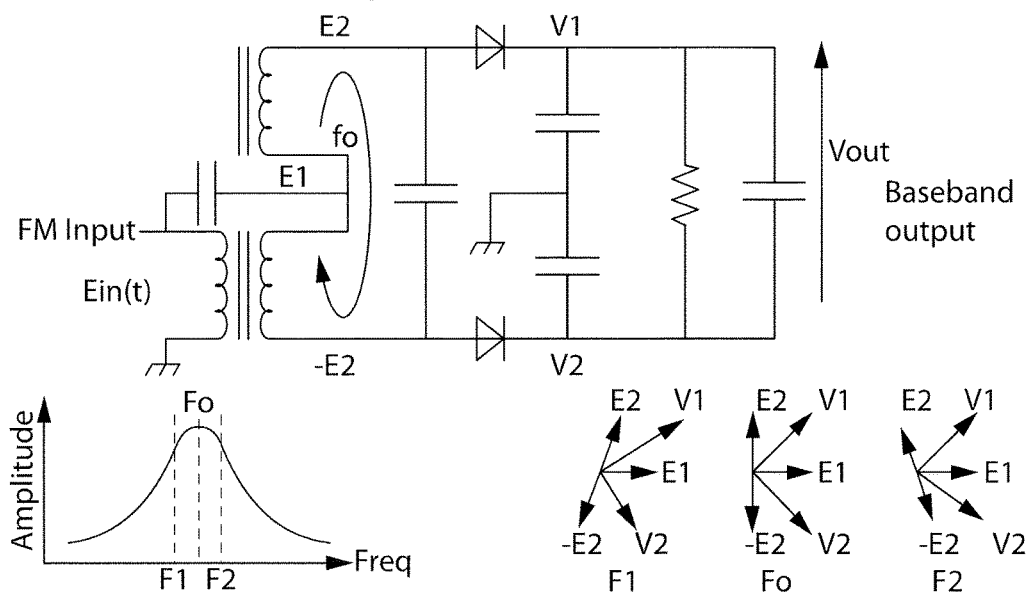
FIG. 1B is another example of a prior art demodulator, viz., Foster-Seeley discriminator along with its frequency and signal characteristics, that operates above the CNR threshold.

Referring now to the figures, wherein like reference numerals represent like parts throughout the several views, exemplary embodiments of the present disclosure will be described in detail. Throughout this description, various components may be identified having specific values, these values are provided as exemplary embodiments and should not be limiting of various concepts of the present invention as many comparable sizes and/or values may be implemented.

The trans-filter 20 minimizes in-band noise and maximizes detection sensitivity of exponentially-modulated signals 20 by eliminating the threshold phenomenon that limits detection sensitivity of exponentially modulated signals (also referred to as "angle modulated signals"). It accomplishes this by elimination of nonlinear circuit elements (e.g., diodes, transistors, non-linear magnetics, etc.) used in conventional exponential modulation detectors such as phase or frequency discriminators.

The filter 20 is a linear circuit that detects or demodulates a variety of different modulation formats. It differentiates the input signal and transforms in-band stationary AWGN to a parabolic noise density distribution. The outputs of two parallel frequency selective circuits with opposite amplitude slopes are subtracted. Stationary noise components above and below the center frequency cancel each other, resulting in the parabolic noise density. The magnitude of the transfer function is a "V-shaped" slope across the bandwidth of the filter reaching zero as the center frequency. The phase of the transfer function abruptly changes by 180° at the center frequency. Rapid amplitude, phase or frequency variations in the input signal generate impulses at the trans-filter 20 output. Differentiation of the input signal separates the baseband spectrum from the RF (radio frequency) or carrier portion of the signal. The baseband, carrier and noise spectral lines all appear at the output in their respective bands. Since all of the components that comprise the trans-filter 20 are linear, there is no multiplicative reaction between any of the spectral lines. This is the reason that there is no threshold associated with the trans-filter 20. Since the frequency spectra of the baseband, carrier and noise all exist at the output of the trans-filter, but in their respective bands, they can be separated by judicious filtering. Because flat noise at the input is transformed by the linear slope into a parabolic noise density distribution and the power of a FM signal increases as the square of the deviation, the output SNR is increased by the well-known FM improvement equation:

$$\text{Output SNR in } f_m = P_S/P_N = (3/2)(C/KTf_m)(\Delta F/f_m)^2 \quad \text{(Equation \#1)}$$

where:
$P_S$=signal power and $P_N$=noise power;
C=input carrier signal power;
K=Boltzman's Constant;
T=Noise temperature in degrees K;
$f_m$=highest frequency in modulated signal;
$\Delta F$=frequency deviation.
Equation #1 can be rewritten as:

$$\text{Output SNR} = (3/2)(C/KTB)(\Delta F/B)^2 = (3/2)(CNR)(\Delta F/B)^2 \quad \text{(Equation \#2)}$$

where (C/KTB)=input (CNR) in the information band B. The trans-filter 20 provides FM improvement without the threshold limitation of conventional FM demodulators. This results in a more sensitive radio wave detector that can operate in noisier environments and with much weaker signals than any other currently-used devices. The sensitivity of this device is greater than that of the "matched filter" by the factor $(3/2)(\Delta F/B)^2$, known in the industry as the "FM Improvement Factor."

In contrast, the quantity C/KTB is also the optimum SNR or the best that can be achieved with a matched filter. Thus, in conventional devices/methods, the best performance is given by:

$$\text{Output SNR}_{matched\ filter} = \text{Input CNR}.$$

As will also be discussed below, a plurality of identical trans-filters 20 can be cascaded, with each one providing additional rejection of in-band noise while passing exponentially-modulated signals undiminished. For FSK (frequency-shift keying), BPSK (binary phase shift keying) and PAM (pulse amplitude modulation) and other exponentially modulated signals, cascading trans-filters produces increasingly large impulses at the signal transitions. The fundamental frequency of the transients occur at baseband and can be recovered without additional frequency conversion or synchronization. In addition, the transients, having a large peak to average ratio, are even more easily detected. Doppler and data rate information may also be obtained from the impulses, thereby simplifying the demodulation process.

The trans-filter 20 may be used to provide superior reception in a multitude of applications such as digital FM broadcast of voice or music, digital data, GPS, radar, sonar, medical imaging, geographical mapping, and oil/mineral exploration, by way of example only.

The trans-filter 20 accomplishes this by using linear frequency or phase sensitive networks that produce outputs that maintain a 180 degree phase relationship relative to each other over the exponential modulation band. The frequency sensitive network outputs can then be summed to produce an output whose amplitude is proportional to frequency or phase deviation of the input signal. Hybrid signal modulation methods utilizing both amplitude modulation (AM) and phase modulation (PM) can also benefit from the noise rejection characteristics of the trans-filter 20.

It should be noted that the term "filter" as used with regard to the trans-filter 20 is meant by Applicant to describe any implementation of the features associated with the trans-filter 20. Therefore, the term "filter" is not limited to a discrete component design or even an analog design but also includes a solid state/integrated circuit configuration, a digital implementation formed in computer code, or any other manner of implementing the features of the trans-filter 20 as described herein. In addition, the trans-filter 20 can be a module, or a stage(s) in a larger apparatus or device such as, but not limited to, a data or communication receiver, etc. Furthermore, the term "filter" is meant to cover one or more of the trans-filters 20 if a cascade (e.g., at least two trans-filters 20 are coupled together) of these trans-filters 20 is implemented.

Figure 2:
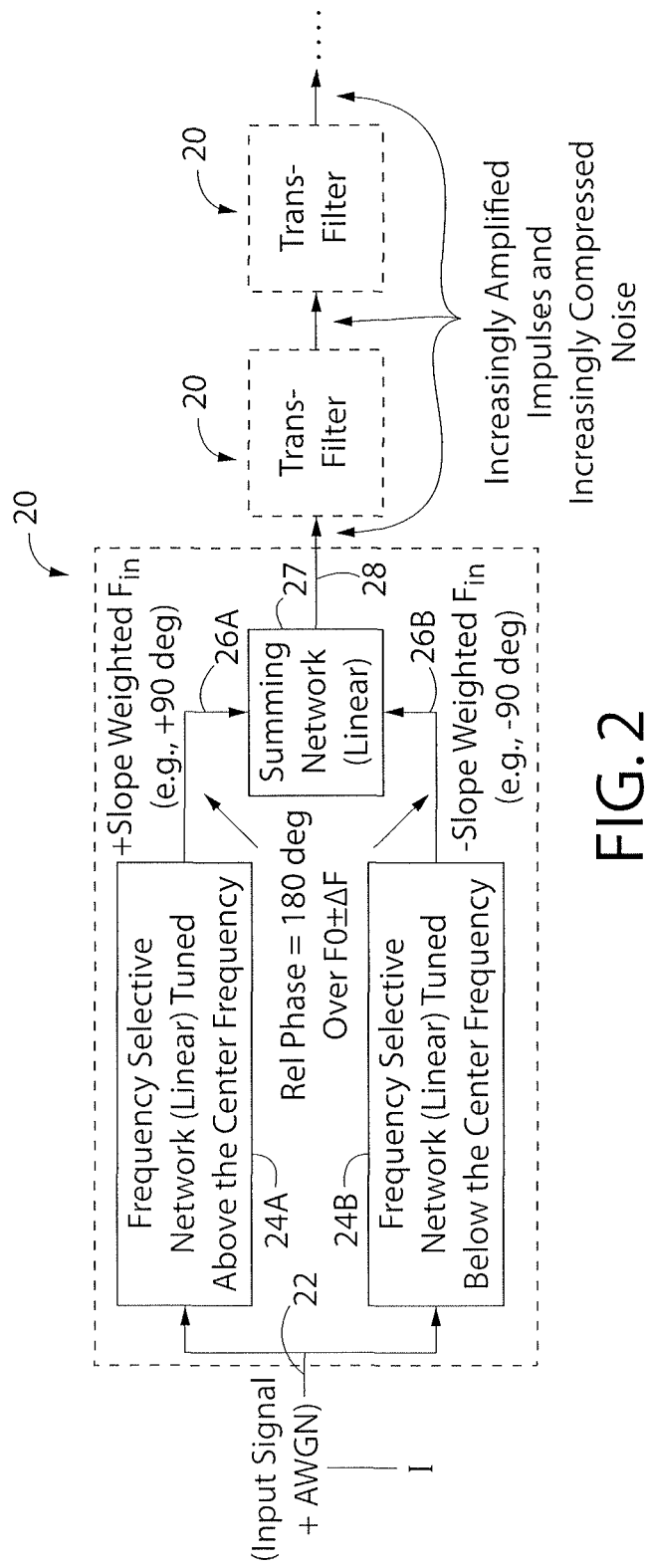
FIG. 2 is a block diagram of the filter invention of the present application, hereinafter referred to as the "trans-filter" and also depicting a plurality of these trans-filters being cascaded for increasing noise compression and impulse amplitude where these impulses are generated at data transitions for many modulation formats.
Figure 3:
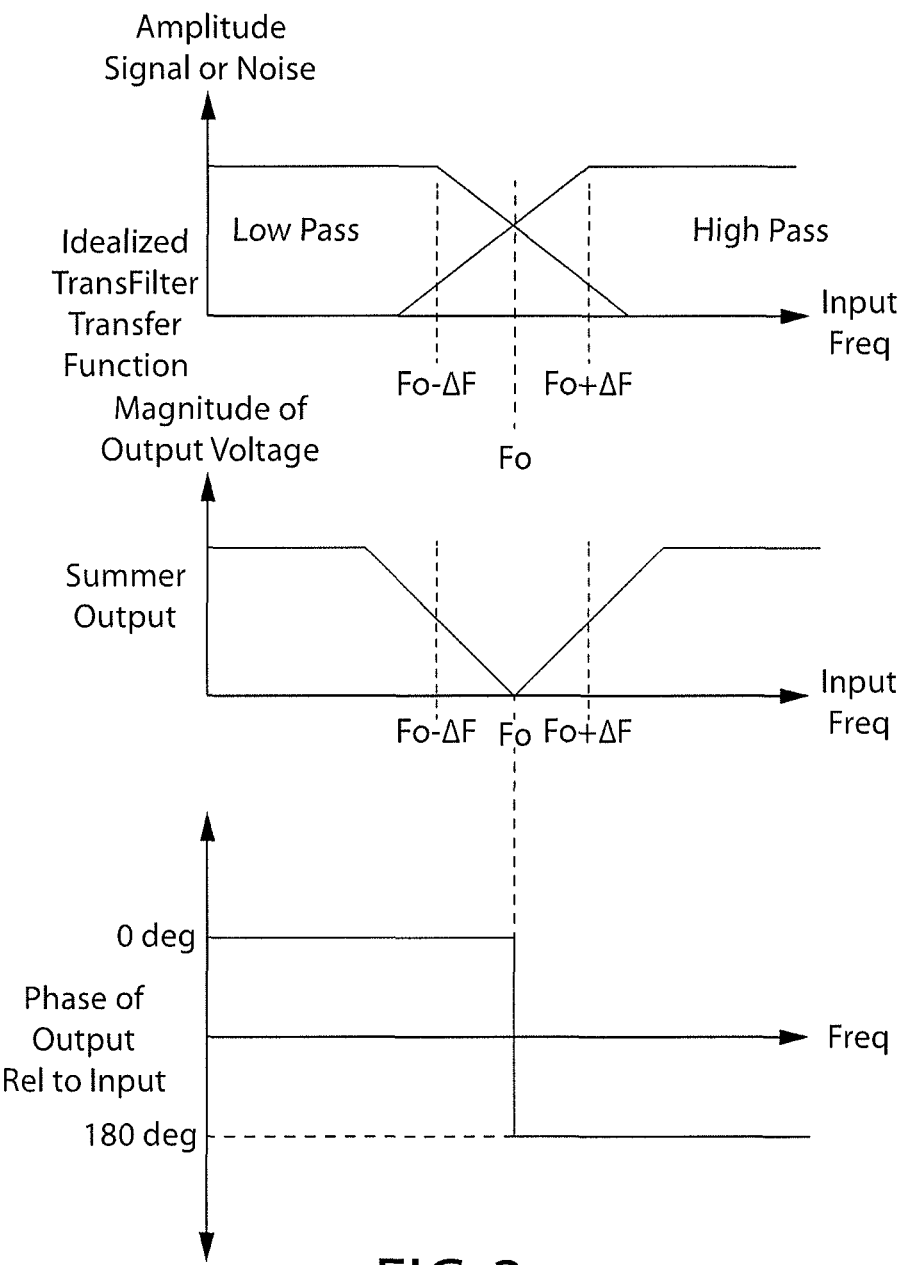
FIG. 3 are respective frequency responses for the signal emanating from the upper frequency selective network, the lower frequency selective network and the signal emanating from the summer.
Figure 6:
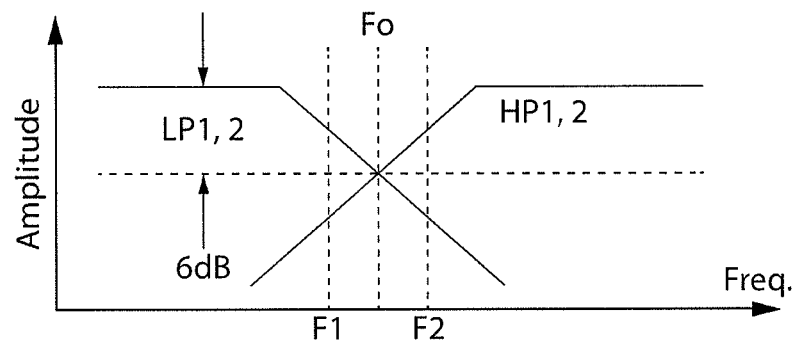
FIG. 6 is the amplitude vs. frequency response of the two high and low pass filters' outputs.

In particular, as shown in FIG. 2, a frequency modulated (FM) signal I, including additive white Gaussian noise (AWGN), is fed into an input 22 to the trans-filter 20. The signal I is simultaneously fed to a frequency selective network 24A that is tuned above the center frequency (e.g., two single high pass filters, or an even number thereof) and a frequency selective network 24B that is tuned below the center frequency (e.g., two single pole low pass filters, or an even number thereof), both of which are linear, to generate respective slope-weighted signals 26A and 26B that are 180° out of phase. Network 24A shifts the phase of FM signal 10 by +90° while network 24B shifts the phase of FM signal 10 by −90°. As the input frequency varies (over $F_0 + \Delta F$), the signals 26A and 26B (having respective vector notations, v1 and v2) remain at 180° phase relative to each other. Thus, at the center frequency ($F_0$), the signals 26A and 26B are equal in amplitude and 180° out of phase. See FIGS. 3 and 6-7.

These two signals 26A and 26B are then fed to a summing network 27 (also linear), thereby output signal 28 having a zero amplitude at this frequency, $F_O$. This accounts for the linear rejection of stationary noise density voltage that results in parabolic weighting of noise power density over the baseband. The signal deviation is undiminished and therefore the trans-filter 20 reduces only the stationary AWGN.

Figure 7:
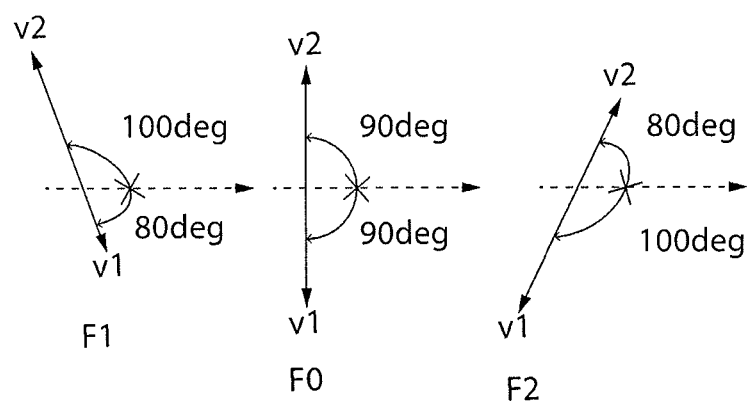
FIG. 7 is a vector diagram showing the amplitude and phase of v1 and v2 vectors at the frequencies $F_1$, $F_0$ and $F_2$ of the trans-filter corresponding to FIGS. 5-6.
Figure 8:
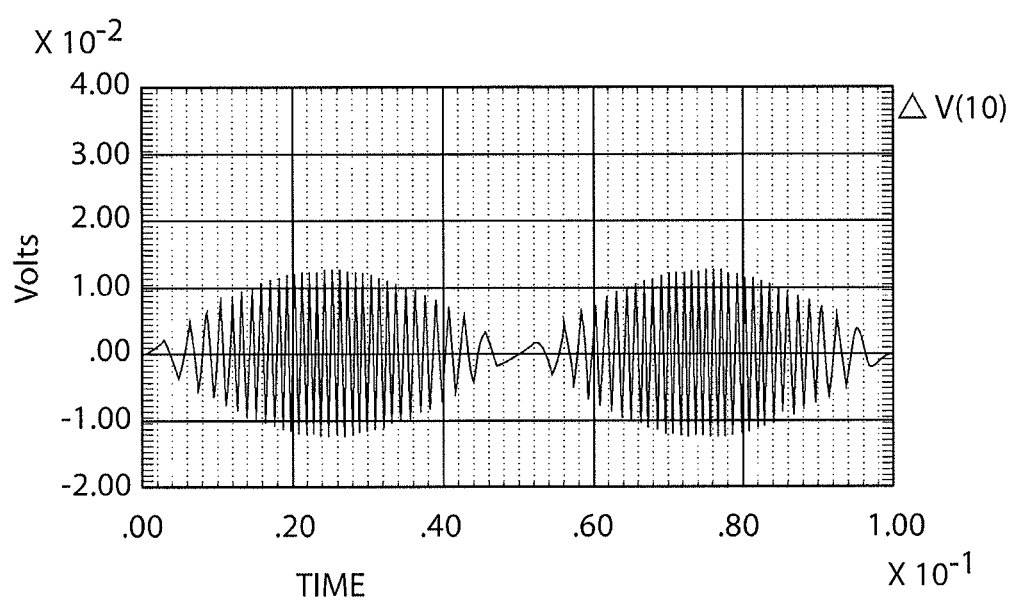
FIG. 8 is a depiction of the carrier envelope at the sum output of the trans-filter.

As mentioned previously, the outputs 26A/26B of the two frequency sensitive networks are summed together at the sum network 27 to produce a single output 28. The sum output 28 has the same instantaneous frequency as the input. The instantaneous amplitude is a function of the frequency offset from the center frequency. The carrier phase at the summer output 28 reverses each time the carrier passes through the center frequency. This gives the output 28 the appearance of a Double Sideband Suppressed Carrier (DSBSC)-like waveform with a frequency modulated carrier inside the envelope. The carrier phase at the sum 28 output is shown in FIG. 7 for a single tone analog FM carrier input.

Figure 4:
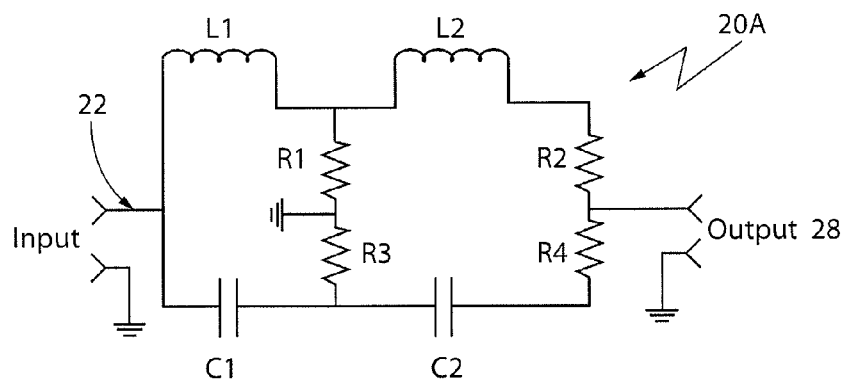
FIG. 4 depicts an exemplary analog version of the trans-filter using two low pass filters in the upper path and two high pass filters in the lower path, where R2 and R4 are both parts of the low pass and high pass filters and the summing network.
Figure 5:
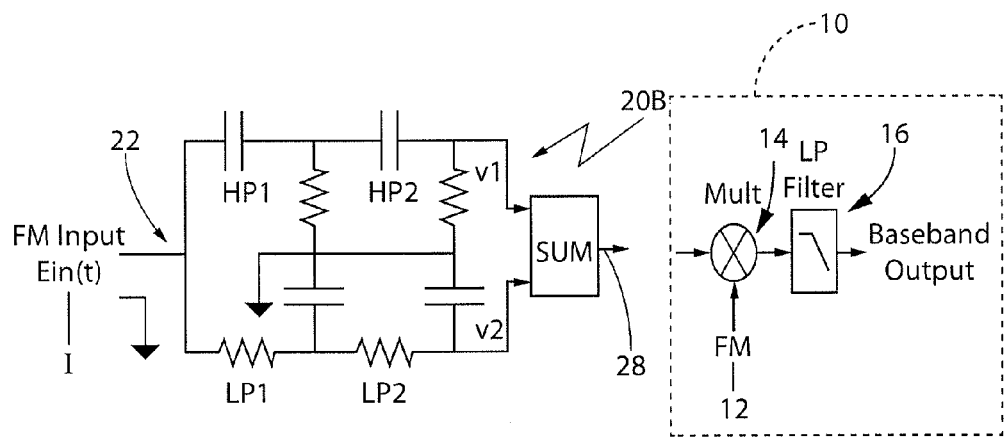
FIG. 5 is another analog version of the trans-filter using two high pass filters and two low pass filters whose 180 degrees-out-phase outputs are then fed to a summer and wherein the summer output, in certain circumstances, may be processed to extract the baseband information.
Figure 9:
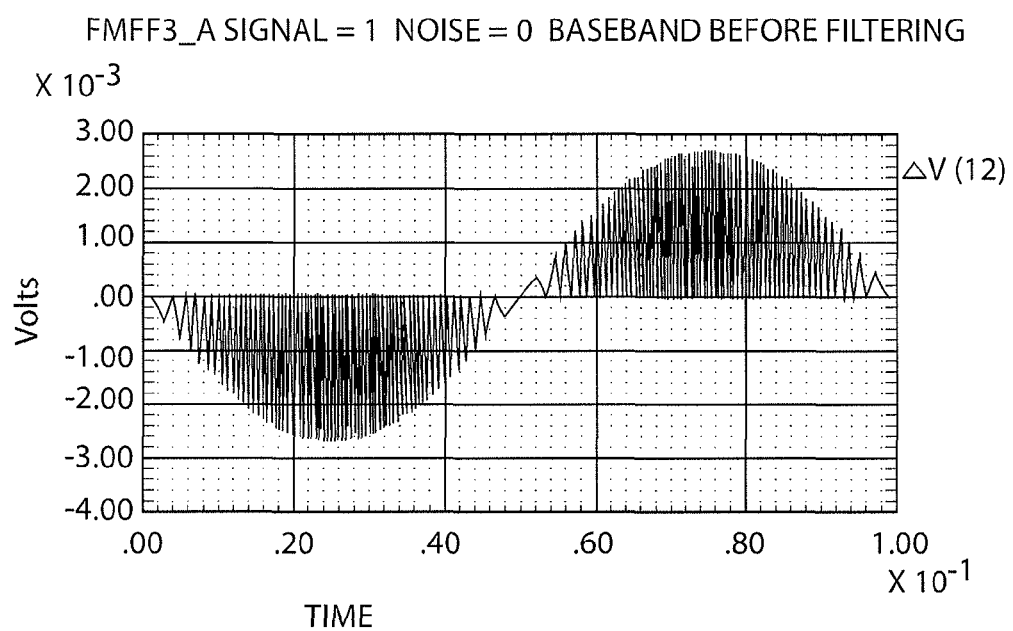
FIG. 9 is timewise depiction of the output multiplier.

FIGS. 4 and 5 provide two exemplary analog embodiments, namely, 20A and 20B, respectively, of the trans-filter 20 and as described previously, because the noise is compressed, the edges of the modulated signal can be easily identified. As a result, there is no need for any conventional demodulation. However, in some circumstances (e.g., in a detector for a Doppler radar, also referred to as a "correlation receiver") the baseband signal may be recovered by using a conventional demodulation stage 10, as shown in FIG. 5; in particular, the demodulation stage 10 multiplies the sum output 28 by a noiseless synchronized replica 12 of the transmitted signal. Furthermore, the multiplier 14 (e.g., product detector) is linear and produces only the sum and difference products of the inputs (see FIG. 9). A low pass filter 16 ejects the carrier and the high order product.

As can be seen from FIGS. 4-5, the frequency selective network tuned above the center frequency 24A may comprise two high pass filters, HP1/HP2 while the frequency selective network tuned below the center frequency 24B may comprise two low pass filter LP1/LP2. The respective output of these two networks are the signals 26A/26B, discussed previously.

It should be further noted that the linear frequency selective networks 24A/24B may each comprise respective band-pass filters.

Figure 10:
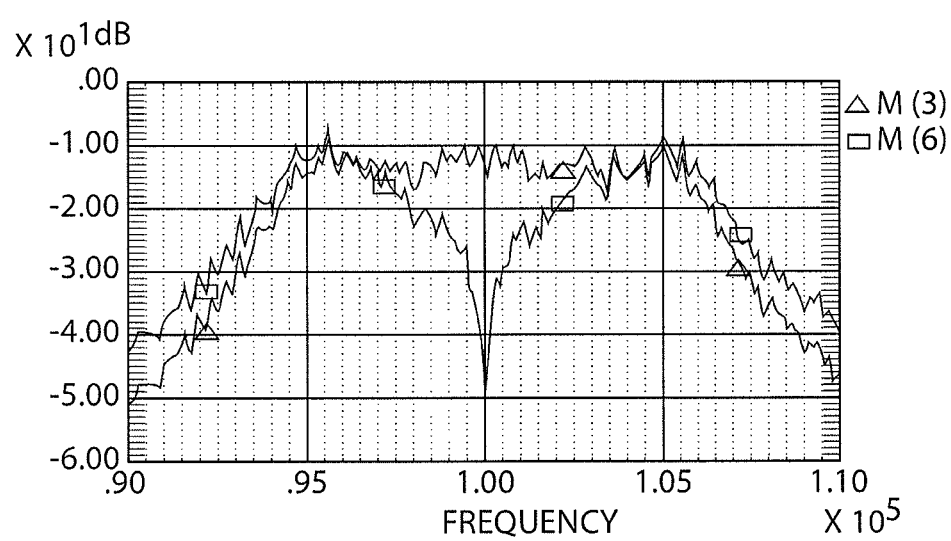
FIG. 10 is a frequency diagram of input and output spectra of the trans-filter, showing the output of the trans-filter having a null at the center frequency even when no carrier, but only noise, is present and demonstrating proof of the linearity (absence the threshold)
Figure 11:
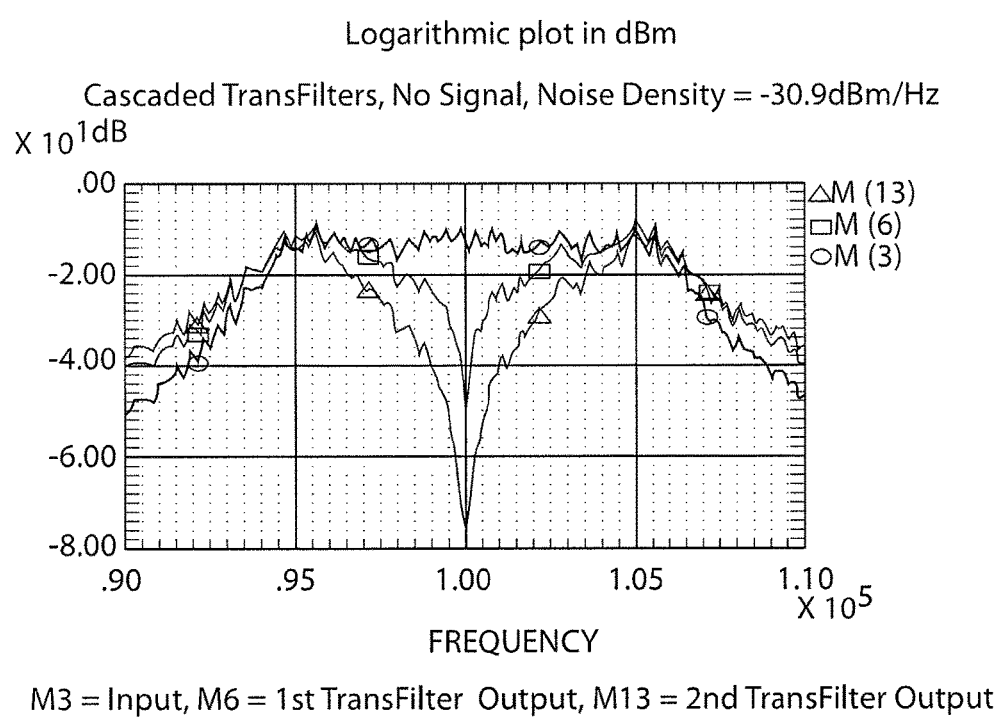
FIG. 11 is a diagram depicting the frequency spectrum at the outputs of two (by way of example only) cascaded trans-filters, showing the absence of the threshold.

As mentioned earlier with regard to the vector diagrams (FIG. 7), the output spectrum of the trans-filter 20 has a null at the center frequency, $F_O$, even when no signal is present. See FIG. 10 where M(3) depicts the input noise spectrum and M(6) depicts the output noise spectrum of a single trans-filter with no signal present. Cascading identical trans-filters 20, as shown in FIG. 2, results in increased noise rejection multiplicatively. The limit is the intrinsic noise of the filter and summing network 27 elements used. Signal transmission through multiple trans-filters 20 is also multiplicative. The resulting distortion can be compensated for by pre-distortion in a fashion similar to pre-emphasis of audio signals in FM Broadcasting. See FIG. 11 which illustrates the additional noise suppression provided by cascading two (by way of example only) trans-filters 20. Thus, a key improvement provided by the trans-filter 20 is cumulative, i.e., cascading trans-filters 20 of equal bandwidth results in increased improvement of signal-to-noise (SNR) ratio. As a result, if one trans-filter 20 provides 20 dB improvement in the SNR, then two identical trans-filters 20 provide 40 dB improvement in SNR. In contrast, cascading "matched filters," of equal bandwidth, produces no additional improvements in SNR.

Cascading trans-filters 20 increases noise rejection, thus increasing the SNR even more relative to a matched filter approach. This can be performed at different intermediate frequencies to avoid having too much gain at any one frequency.

It should be understood that any linear networks having the properties of 180 degree-relative output phase and linear amplitude variation over the FM band under consideration would allow the cited performance to be achieved. Furthermore, it should be understood that analog representations of the trans-filter 20 of FIGS. 4-5 are provided by way of example only and that digital numeric implementations (also referred to as an "algorithmic representation") of the trans-filter 20 are within the broadest scope of the present invention to provide ideal performance with perfect stability. The digital numeric implementation or algorithmic representation is used to detect or demodulate exponentially modulated signals that have been converted to the digital domain by analog-to-digital converter (ADC).

The trans-filter 20 discriminates against stationary AWGN in the signal band (See FIG. 10), thereby increasing the CNR prior to detection. Unlike any conventional band pass filter (e.g., a (matched filter), a plurality of trans-filters 20 of equal bandwidth can be cascaded, providing additional rejection of stationary AWGN in the pass band (See FIG. 11). The term "signal band" or "in-band" refers to the band occupied by the transmitted signal.

Thus, the foregoing discloses an apparatus and method that eliminates the threshold phenomenon that limits detection sensitivity of exponentially modulated signals. The apparatus and method achieve this by the elimination of nonlinear components and modification of the frequency selective networks to produce a sloping amplitude that is proportional to frequency offset from a center frequency and passes through zero at the center frequency. The opposite sloping amplitude and 180 degree phase difference cause the noise cancellation that transforms flat AWGN to a parabolic shape. The amplitude slope with frequency and the rapid phase reversal at the crossover frequency produce large polarized impulses at the transitions for digitally modulated signals of all types, thereby making the trans-filter 20 a universal demodulator. Elimination of non-linear circuit elements, compression of in-band noise and the derivative action of the sloping amplitude vs. frequency characteristic together with the abrupt phase reversal at crossover, combine to produce large polarized impulses at the modulation rate (Baseband) and do not require conversion to baseband. Cascading trans-filters 20 increases the magnitude of the impulse relative to the noise and carrier leakage.

Trans-Filter 20 Impulse Generator/Demodulator

The trans-filter 20 transfer function is basically a frequency domain derivative operator. It generates an output that is a function of the rate of change of the frequency at its input. As a result, the trans-filter 20 generates impulses when the input frequency changes abruptly. This is true for all types of digital modulation, whether it be phase, frequency or even abrupt changes of amplitude such as PAM.

The instantaneous reversal of phase of the transfer function when the signal crosses the center frequency of the trans-filter 20 produces polarized impulses that are proportional to the instantaneous frequency change, df/dt, and its sign. For a PAM signal at the trans-filter 20 center frequency, the change in going from off to on is $+F_o$. At the end of the pulse the change is $-F_o$. Either of these changes generate a large enough instantaneous frequency to produce the maximum + or − output of the trans-filter 20. For FSK signals, the output of the first trans-filter 20 is more a sine/cosine conversion rather than an impulse. The second and subsequent trans-filters 20 do produce increasingly large impulses both due to the phase reversal at center frequency and the sharpness of the transition due to the higher order derivative.

While the impulses are generated at the trans-filter output 28 that is centered on $F_o$, their fundamental frequency (viz., the data rate) is at baseband. The trans-filter 20, due to its derivative characteristic, demodulates (viz., converts to baseband) the received signal. Since there are no non-linear components in the trans-filter 20, there is no interaction between any of the frequency components, be they signal or noise. Thus, as discussed previously, there is no threshold phenomenon.

The slope of the trans-filter 20 transfer function converts stationary noise power to a parabolic shape which when integrated over the transmission band relative to the modulation band yields an improvement of $[10 \log(3/2)+20 \log(\Delta F/B)]$ for a single unit due to noise reduction only. For two trans-filters 20, the noise reduction improvement is $[10 \log(5/2)+40 \log(\Delta F/B)]$. For N identical trans-filters 20 cascaded, the reduction in noise is $[10 \log((2N+1)/2)+20N \log(\Delta F/B)]$. The increase in signal impulse voltage with each additional stage is more difficult to evaluate since it is highly dependent the form of modulation and upon rise time limitations. The data in FIGS. 20-23 for 4 cascaded stages with a PAM input indicates an increase of approximately 3 dB in signal amplitude for each added stage.

Figure 12:
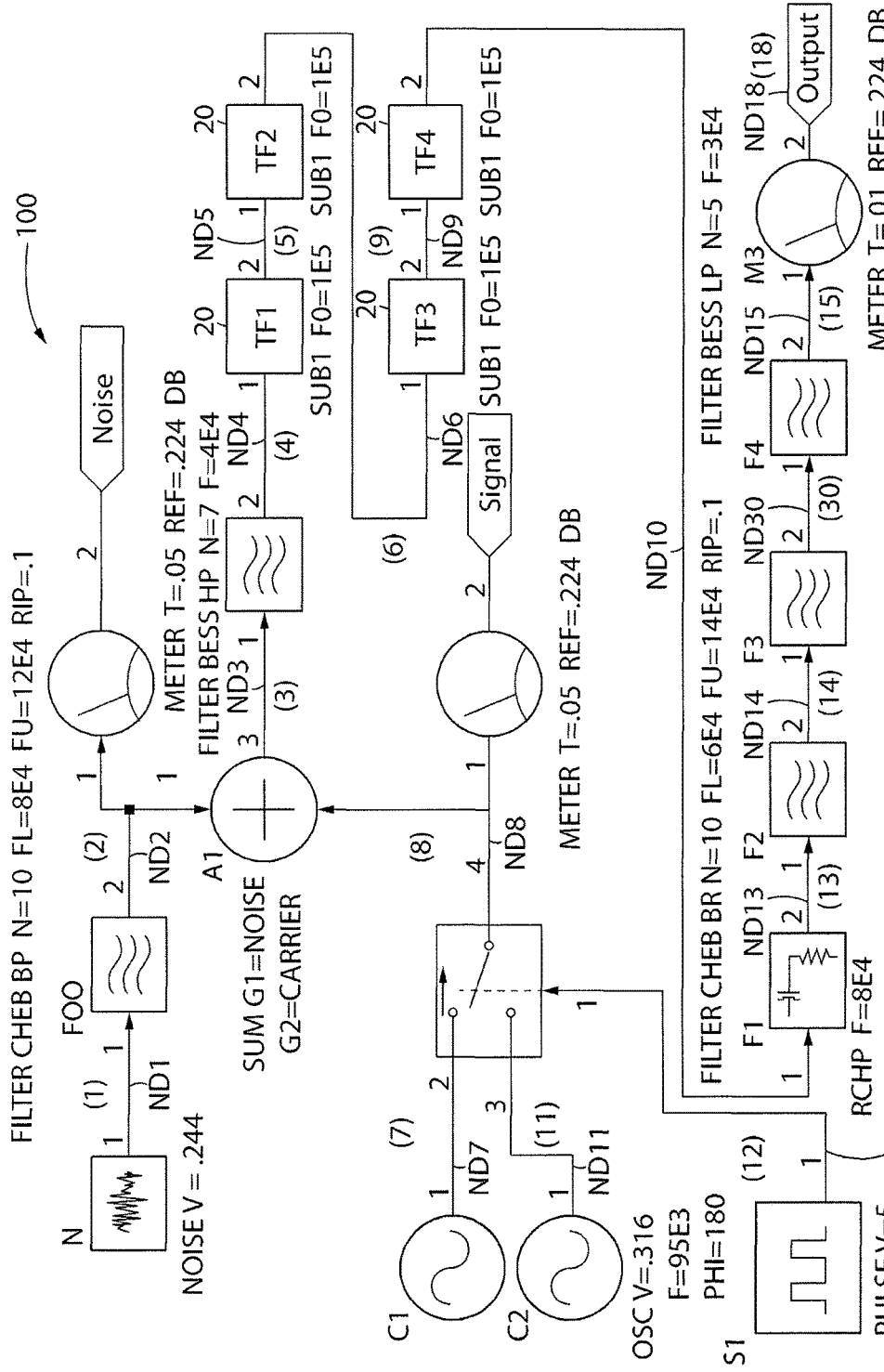
FIG. 12 is a block diagram of a test set up for evaluating a cascade of four (by way of example only) trans-filters and to which the following FIGS. 13-23 pertain.

FIG. 12 depicts a block diagram of a test setup 100 used to evaluate the response of a cascade of four (by way of example only) identical trans-filters 20. An FSK signal is generated using two oscillators and a switch. The mark and space frequencies are C1 at 105 KHz and C2 at 95 KHz. Switching rate is 50 Hz determined by Pulse Generator S1. Noise is provided by noise generator N. Total noise output power is 0 dBm in a 1 MHz band that is uniform in density at −60 dBm/Hz. Signal power at input to summer A1 is 0 dBm. FIGS. 13-23 depict the signals and signal responses of this test setup 100. It should be noted that with regard to the test setup 100, the following information is pertinent:
Carrier Power=C=0 dBM
for FSK modulation FCN=2;
Noise Power Density=−164 dBm/Hz;
For T=3,000 Deg Kelvin;
(C/KT)=−48 dB-Hz for Ps=−212 dBm;
Simulation step size=5E-7 sec; and
Simulation time=0.11 sec.

Noise and signal are combined by the summing network A1. The values of G1 and G2 are used to establish the (C/KT) ratio for each measurement. The value of G1 establishes noise and ranges from 0 to 1E3 (which corresponds to $10^3$). G2 ranges from 0 to 1E-3 (which corresponds to $10^{-3}$). RMS power meters M1 and M2 are provided to measure signal and noise powers to establish the (C/KT) operating point for the measurements. A high pass filter F0 is used to attenuate any vestiges of the baseband signal to a negligible value.

Figure 13:
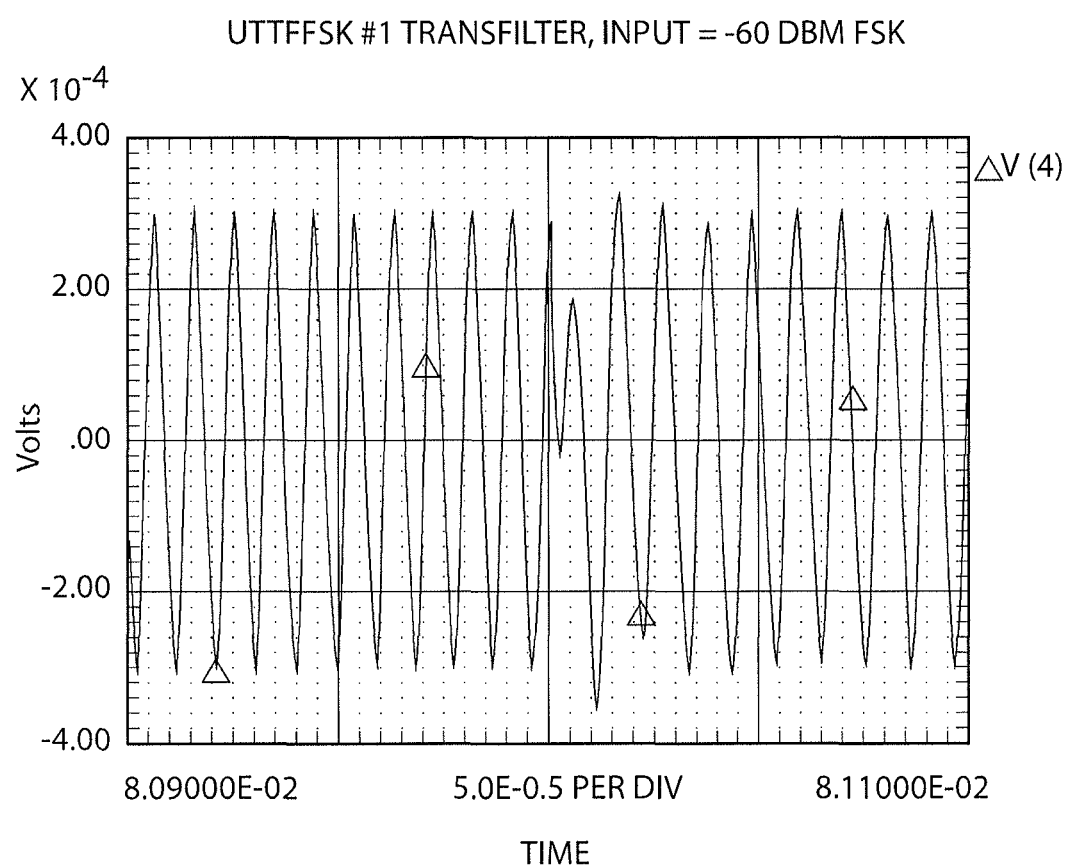
FIG. 13 depicts the frequency-shift keying (FSK) input signal that is high-pass-filtered and applied to a first trans-filter and wherein the signal is at a level of −60 dBm at node ND4.
Figure 14:
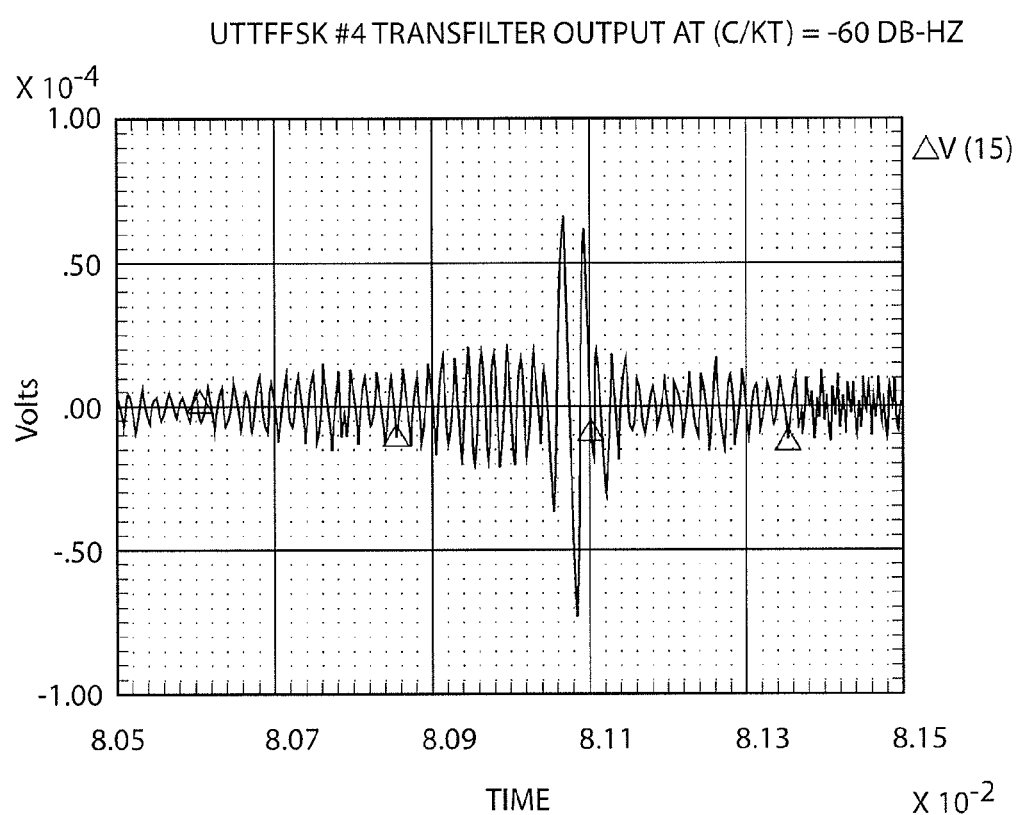
FIG. 14 depicts the trans-filter impulse output for the input signal of FIG. 13 in accordance with the mark/space transitions at node ND15 at an input (C/KT=−50 dB-Hz)
Figure 15:
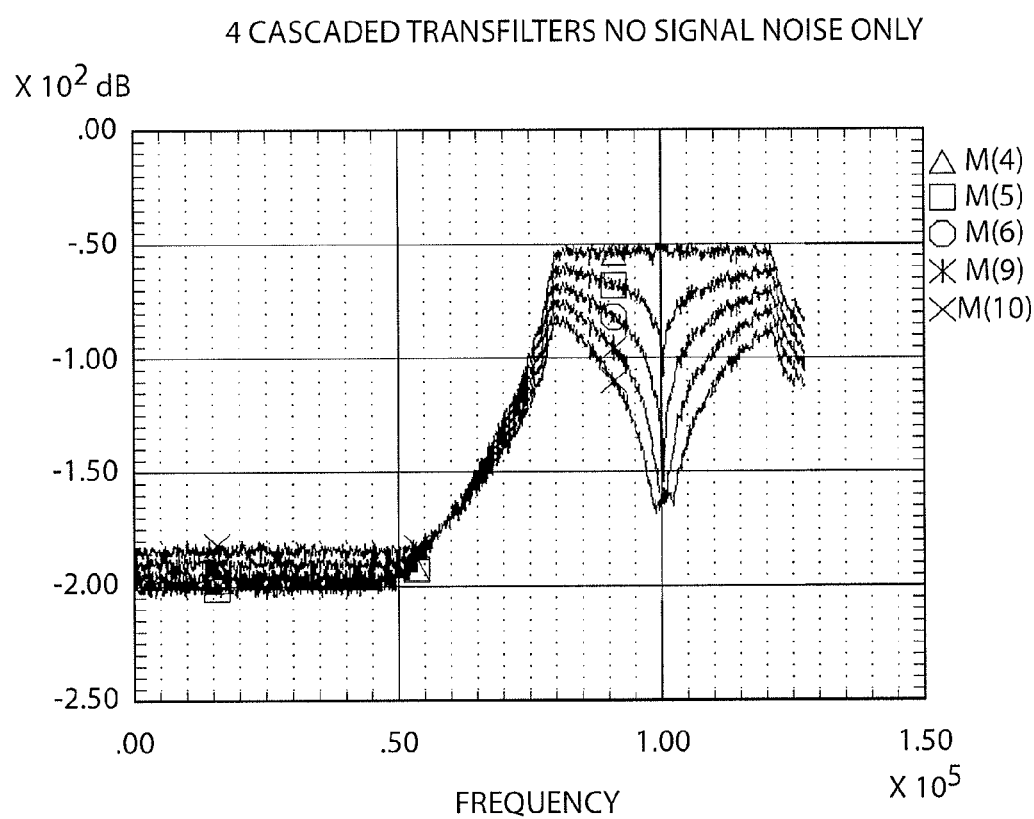
FIG. 15 is a spectrum diagram showing the input noise from the filter F0 and the output of each trans-filter.
Figure 16:
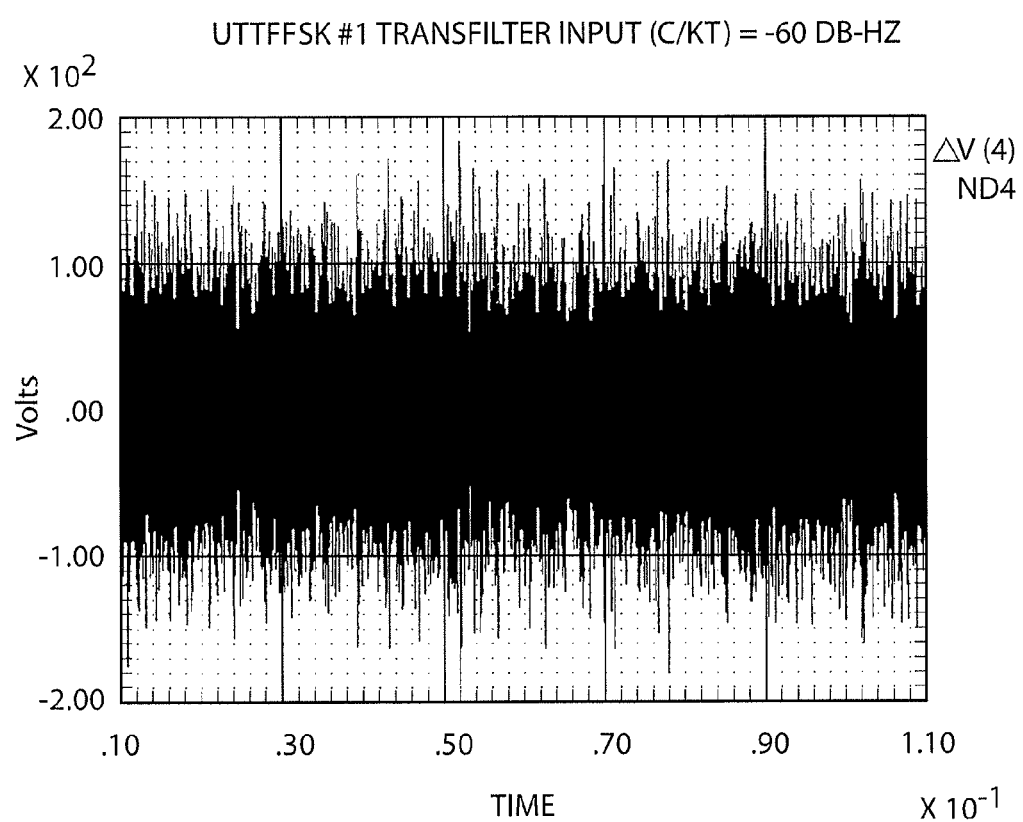
FIG. 16 is a voltage versus time measurement at the first trans-filter input and wherein the vertical scale is ±200 volts and the quantity C/KT=−60 dB-Hz at node ND4.
Figure 17:
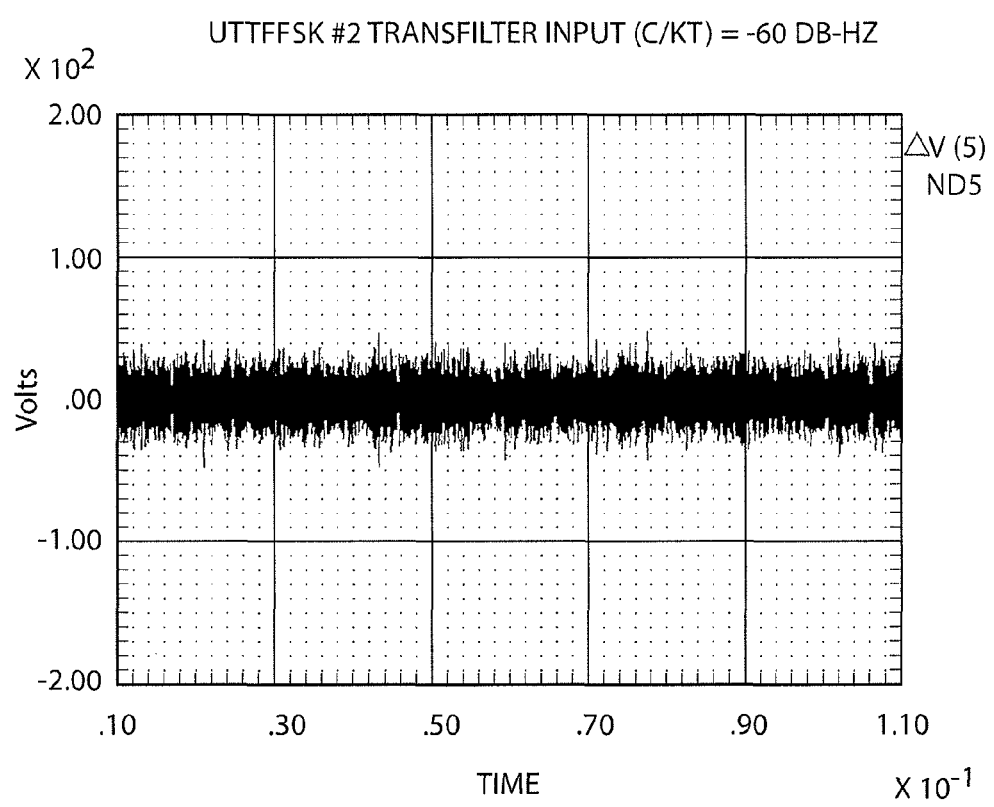
FIG. 17 is a voltage versus time measurement at the second trans-filter input and wherein the vertical scale is ±200 volts and the quantity C/KT=−60 dB-Hz at node ND5.
Figure 18:
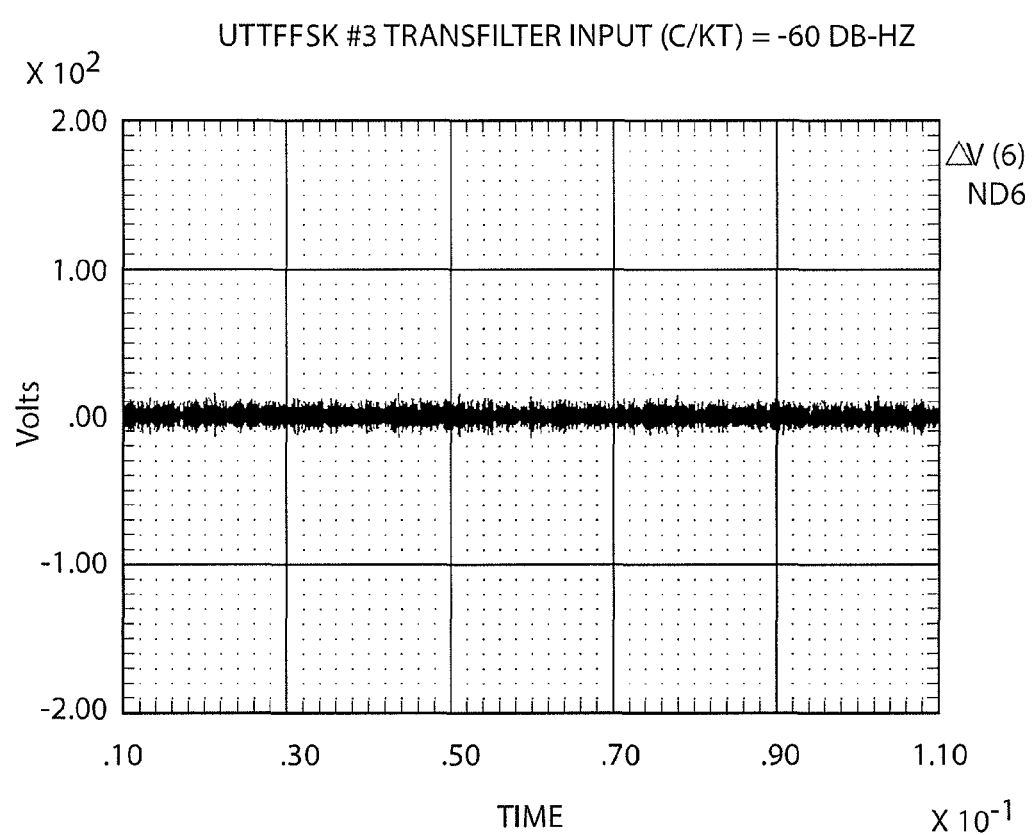
FIG. 18 is a voltage versus time measurement at the third trans-filter input and wherein the vertical scale is ±200 volts and the quantity C/KT=−60 dB-Hz at node ND6.
Figure 19:
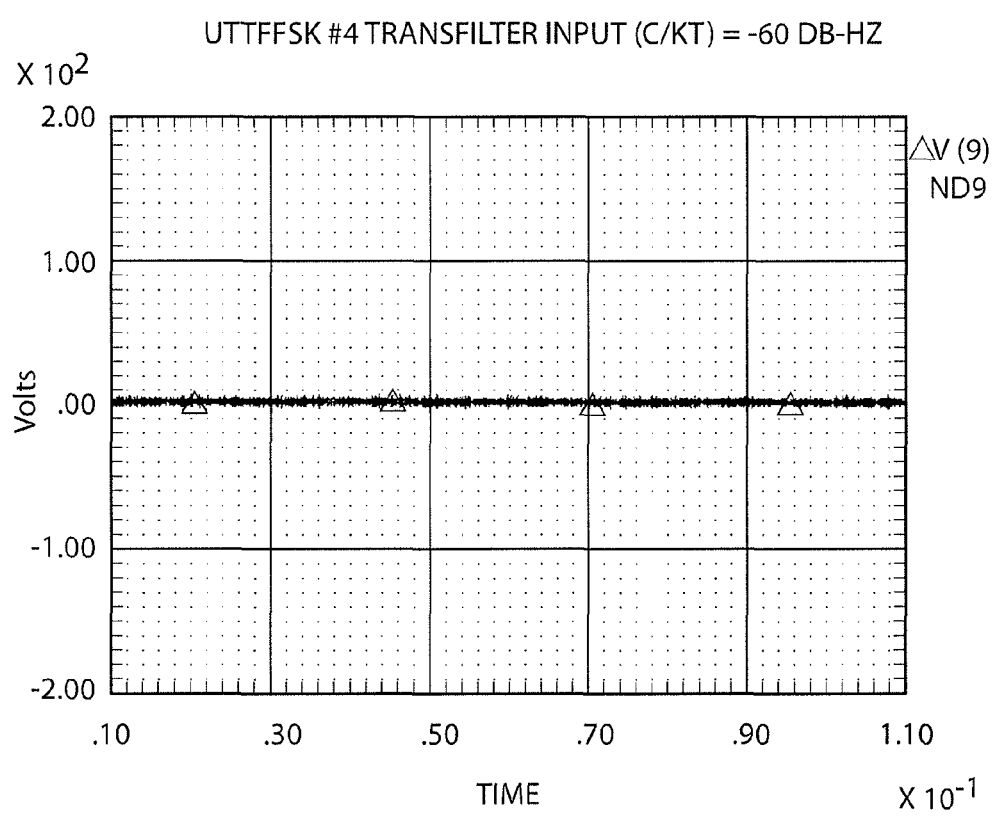
FIG. 19 is a voltage versus time measurement at the fourth trans-filter input and wherein the vertical scale is ±200 volts and the quantity C/KT=−60 dB-Hz at node ND9.
Figure 20:
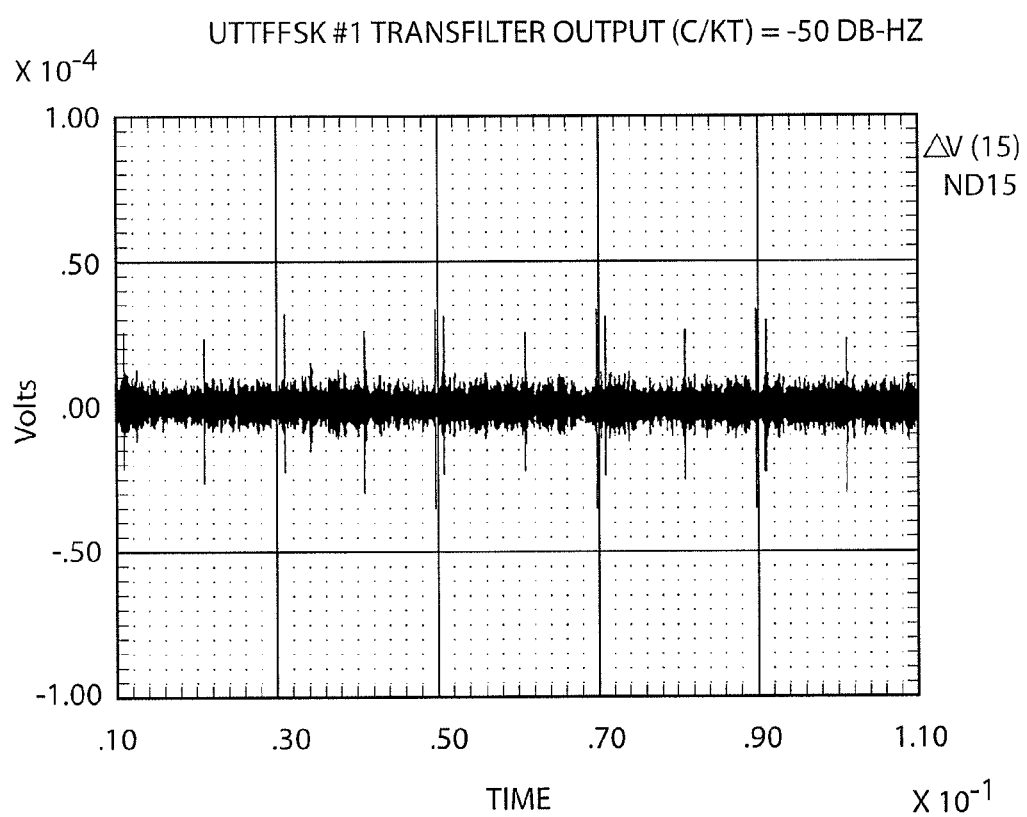
FIG. 20 is a voltage versus time measurement at the output of the first trans-filter, measured at node ND15, using a filter bank to reduce noise at baseband and wherein the impulses and noise at the quantity C/KT=−50 dB-Hz.
Figure 21:
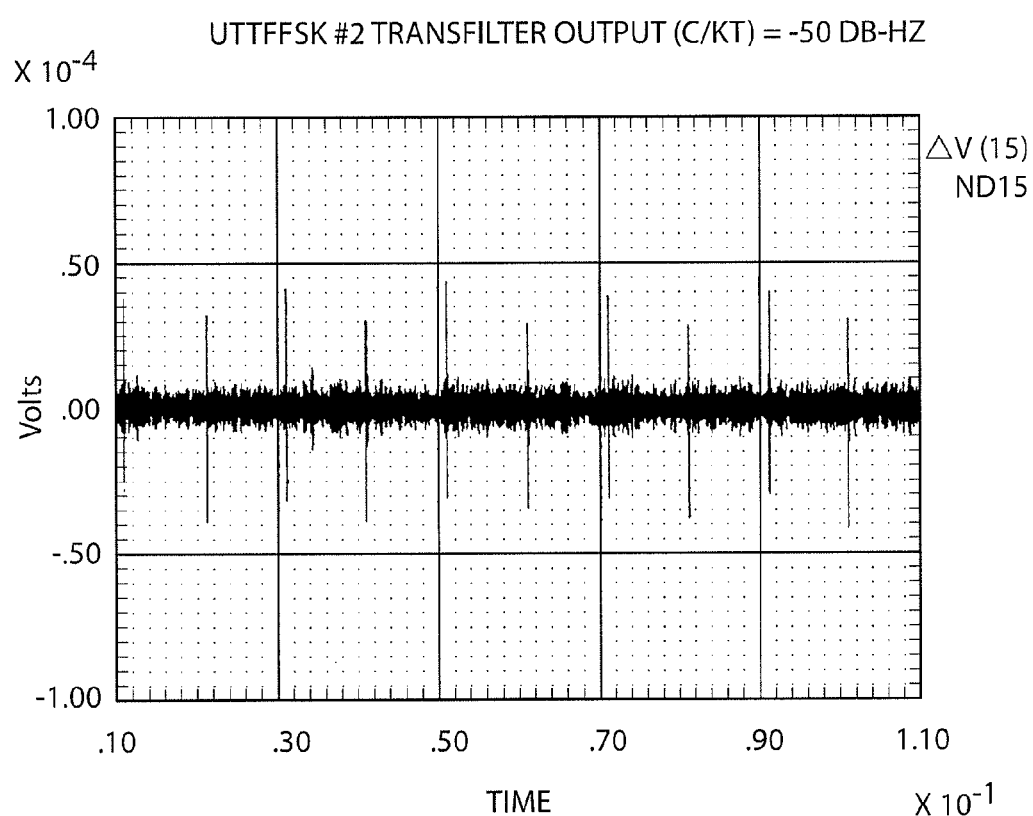
FIG. 21 is a voltage versus time measurement at the output of the second trans-filter, measured at node ND15, using a filter bank to reduce noise at baseband and wherein the impulses and noise at the quantity C/KT=−50 dB-Hz.
Figure 22:
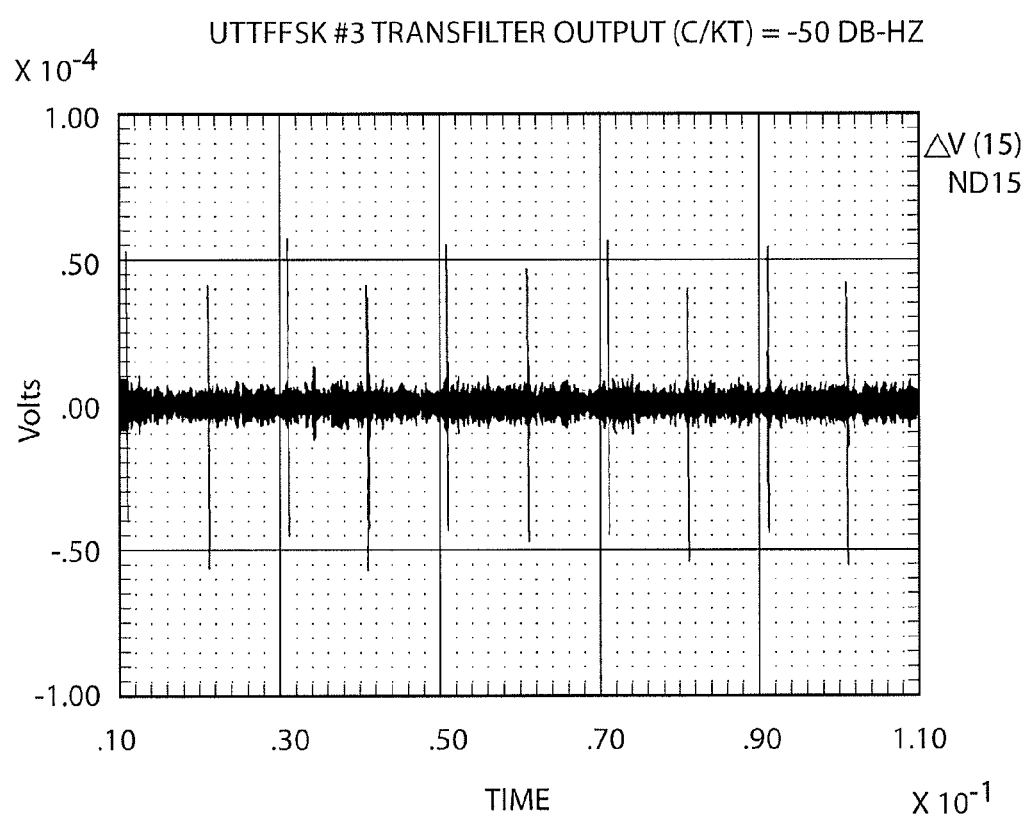
FIG. 22 is a voltage versus time measurement at the output of the third trans-filter, measured at node ND15, using a filter bank to reduce noise at baseband and wherein the impulses and noise at the quantity C/KT=−50 dB-Hz.
Figure 23:
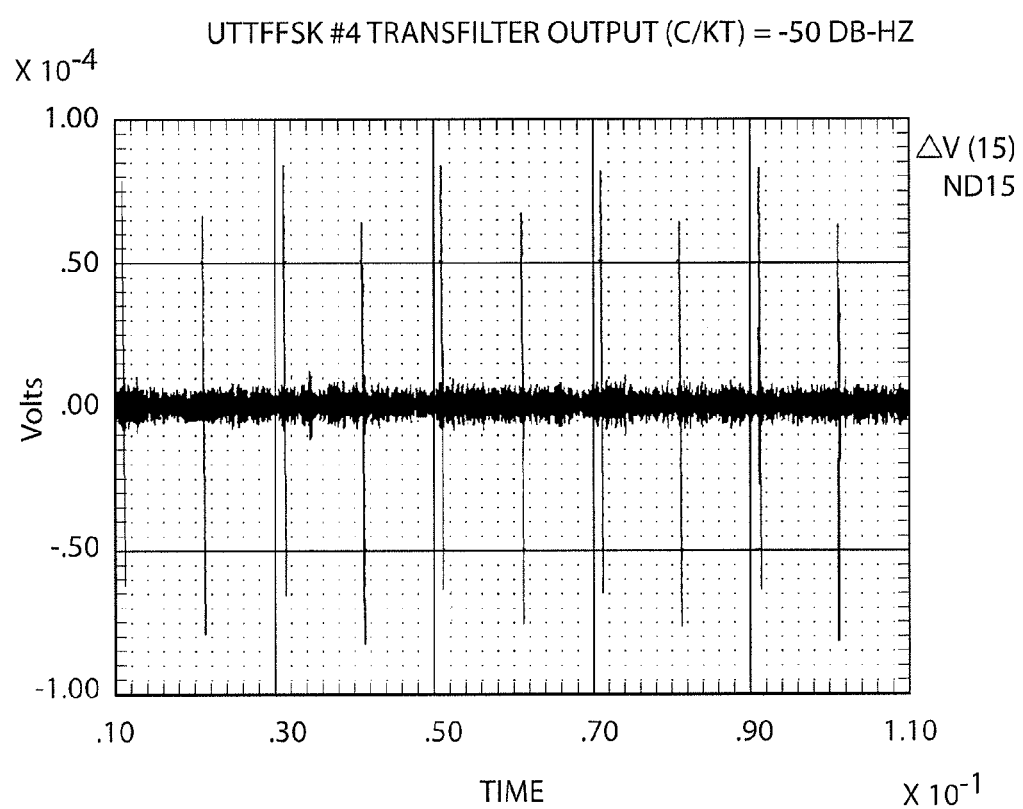
FIG. 23 is a voltage versus time measurement at the output of the fourth trans-filter, measured at node ND15, using a filter bank to reduce noise at baseband and wherein the impulses and noise at the quantity C/KT=−50 dB-Hz.

FIG. 13 shows the FSK signal of the filter F0 output which is fed to the first trans-filter 20; the signal at this point is at a level of −60 dBm. FIG. 14 shows the output pulse resulting from the mark/space transition with respect to FIG. 13. FIG. 15 is a spectrum diagram showing the input noise from the filter F0 and the output of each trans-filter 20 (TF1, TF2, TF3 and T4 shown in FIG. 12). The trans-filter TF1/TF2/TF3/TF4 outputs do not appear parabolic because the vertical scale in FIG. 15 is logarithmic; however, as discussed previously, each trans-filter 20 operates to transform flat noise by the linear slope relationship into a parabolic noise density distribution.

A series of high pass, low pass and band reject filters are provided at the output of the cascaded trans-filters 20 to attenuate noise that tends to obscure the impulses generated by the mark/space transitions. That same chain of filters is used to view the output of each trans-filter 20 (namely, TF1, TF2, TF3 and TF4) in the test circuit 100 at node ND15; thus, the views of FIGS. 20-23 depict the output of trans-filters TF1, TF2, TF3 and TF4, respectively. The band reject filters contribute negligible attenuation and degradation to the impulses that emanate from the summer A1.

FIGS. 16-19 clearly depict the successive compression of the noise at the output of TF1 (node ND4), TF2 (node ND5), TF3 (node ND6) and TF4 (node ND9). FIGS. 19-22 clearly depict the successive accentuation of the impulse outputs of each trans-filter TF1-TF4 as they are viewed at node ND15.

Figure 24:
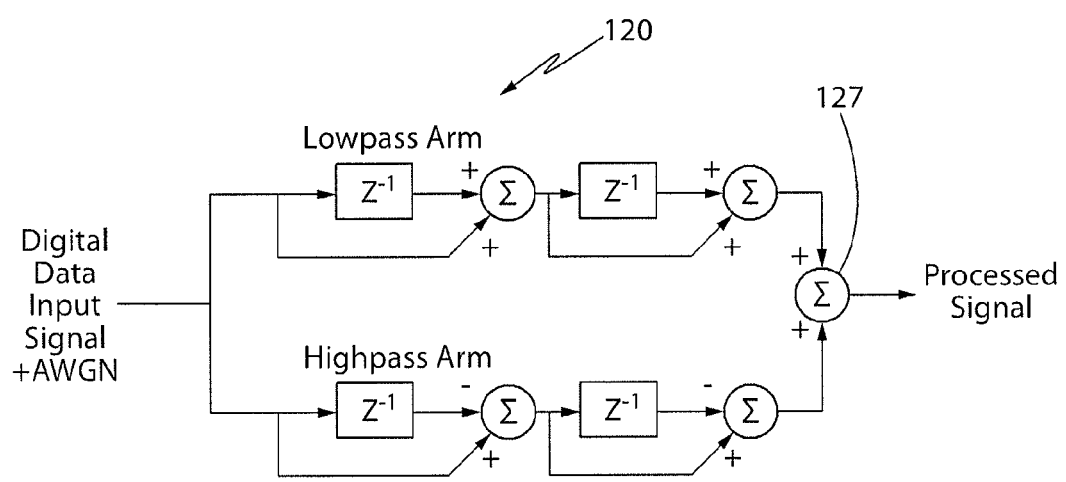
FIG. 24 is a block diagram of a digital trans-filter configuration of the present invention.

FIGS. 24-30 are directed to a digital version of the trans-filter, hereinafter referred to as the digital trans-filter (DTF) 120. In particular, FIG. 24 is a block diagram of the DTF 120. The DTF 120 is a lattice filter in which one arm performs a monotonic low pass filter function, while a second arm performs a monotonic high pass filter function. These filters are designed so that cascading two filters in each arm results in a 180 degree phase shift between the two arms; as such, the amplitude responses of the two arms are exactly equal at the center of the band, i.e., at the sampling frequency ($F_S$) divided by four, $F_S/4$ or also referred to as half of the Nyquist Frequency.

Figure 25B:
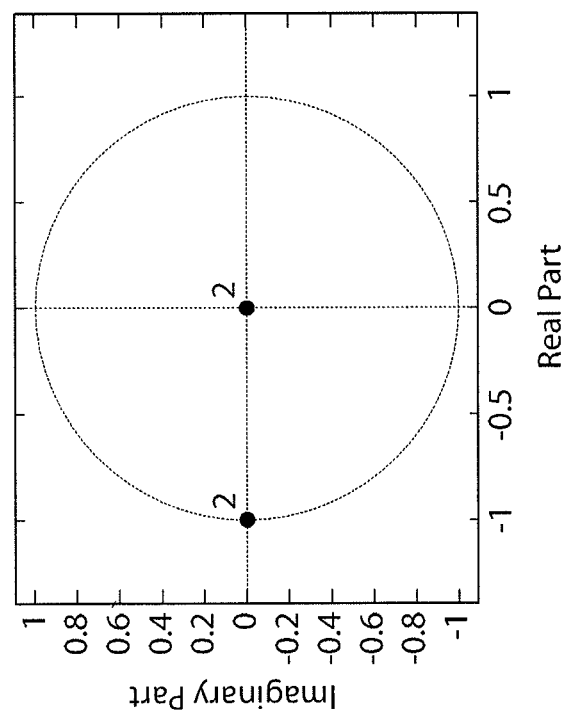
FIG. 25B is a high pass filter pole-zero z-plane representation of the high pass arm of FIG. 24.
Figure 25A:
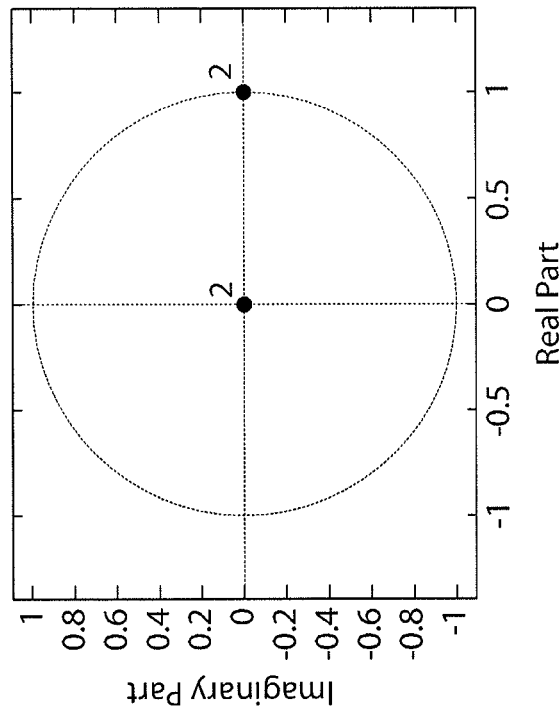
FIG. 25A is a low pass filter pole-zero z-plane representation of the low pass arm of FIG. 24.

FIGS. 25A/25B provide the low pass filter pole-zero z-plane representation of the low pass arm and the high pass filter pole-zero z-plan representation of the high pass arm, respectively.

Figure 26:
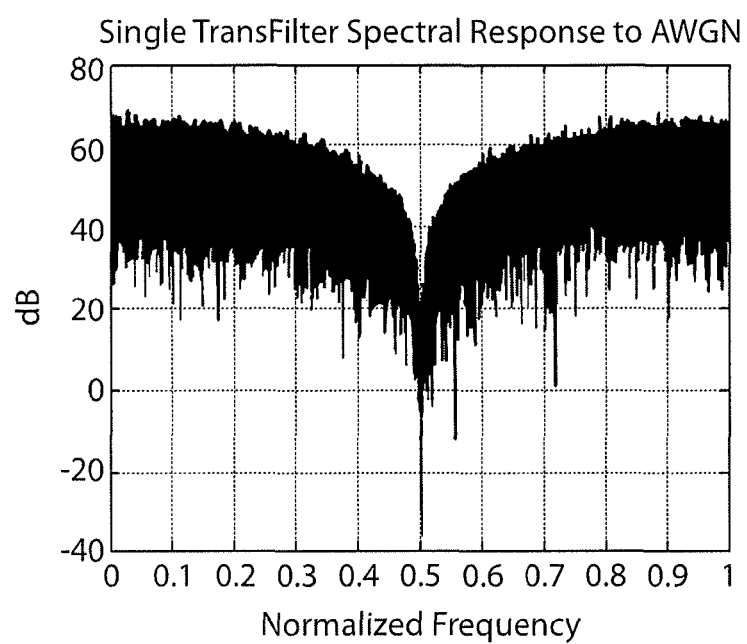
FIG. 26 is the spectral response of the digital trans-filter.
Figure 27:
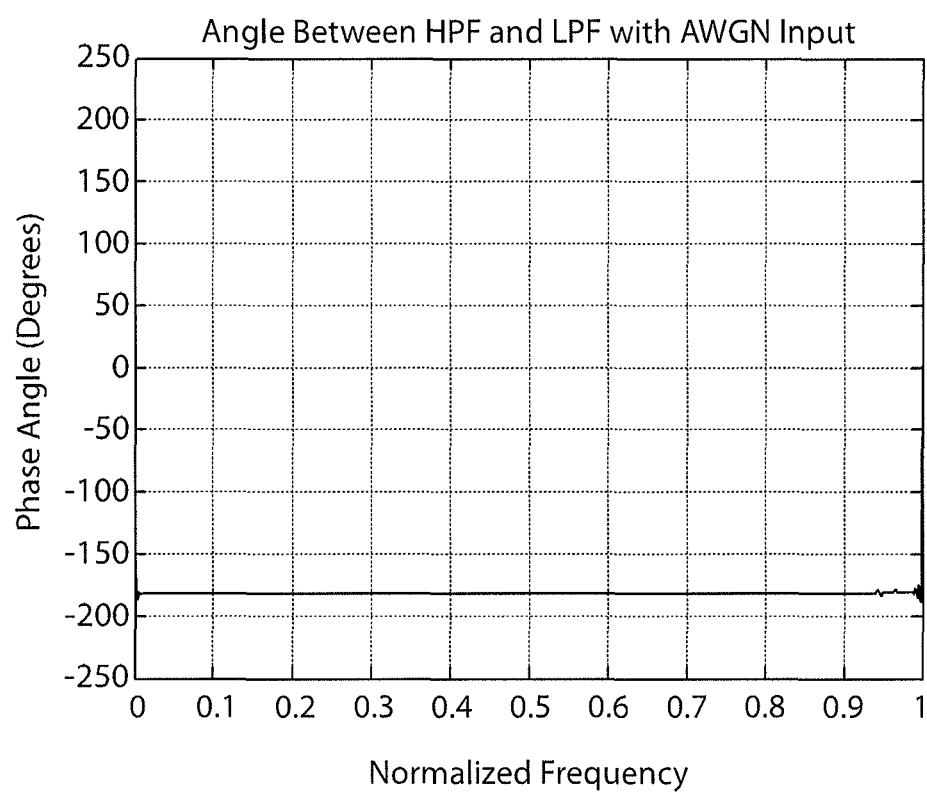
FIG. 27 is the phase response of the digital trans-filter.
Figure 28A:
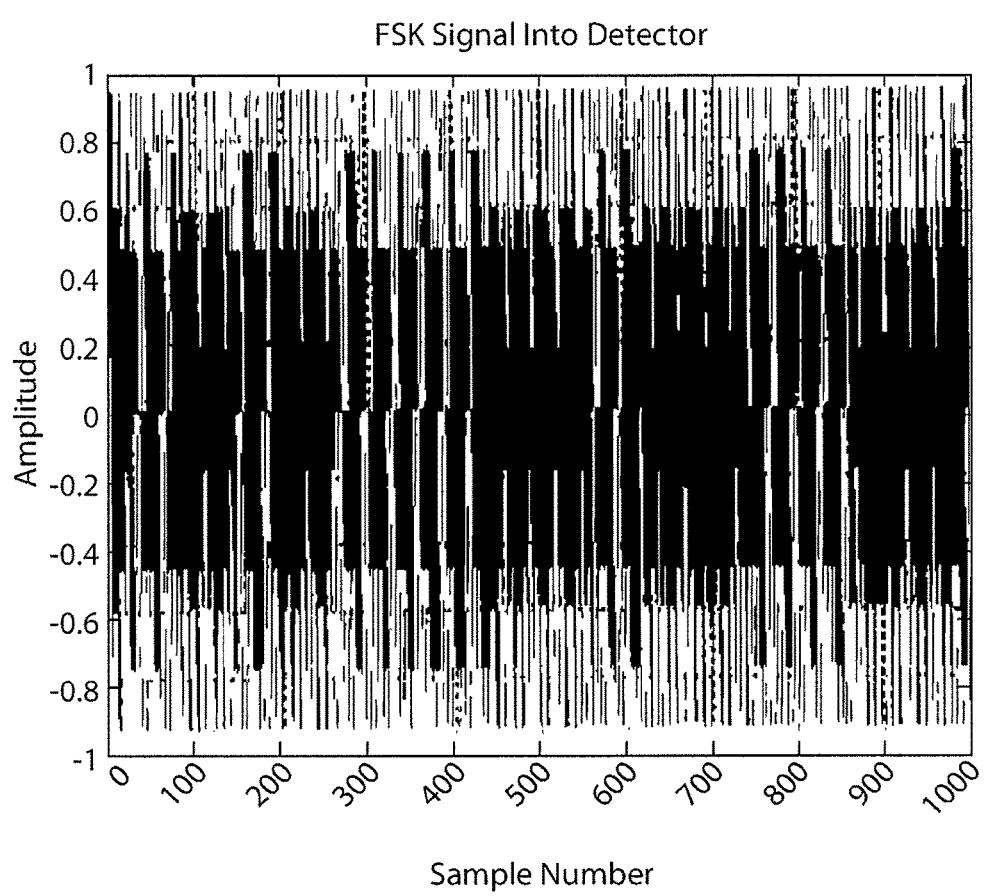
FIG. 28A-28B are the input signal and the input noise, respectively, to the digital trans-filter.
Figure 28B:
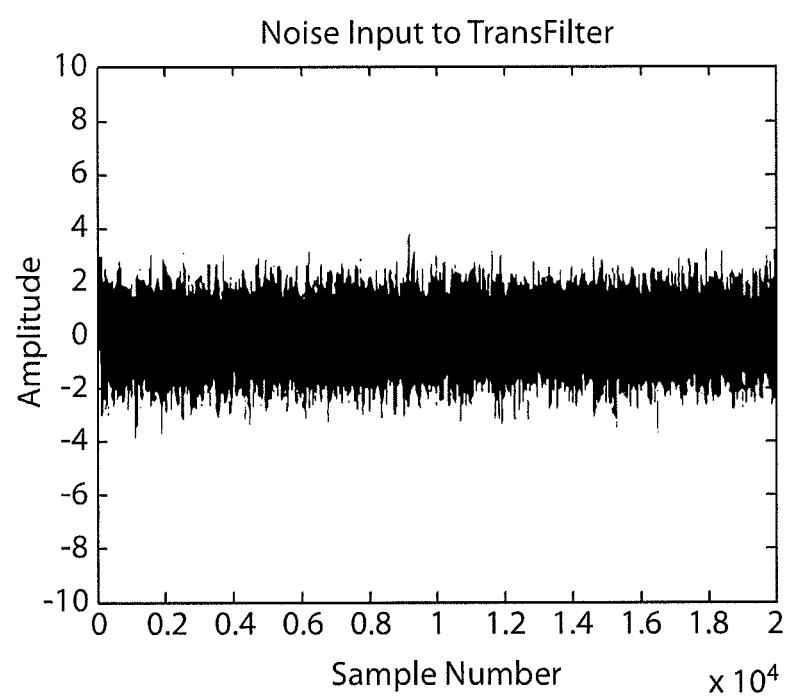
Figure 29A:
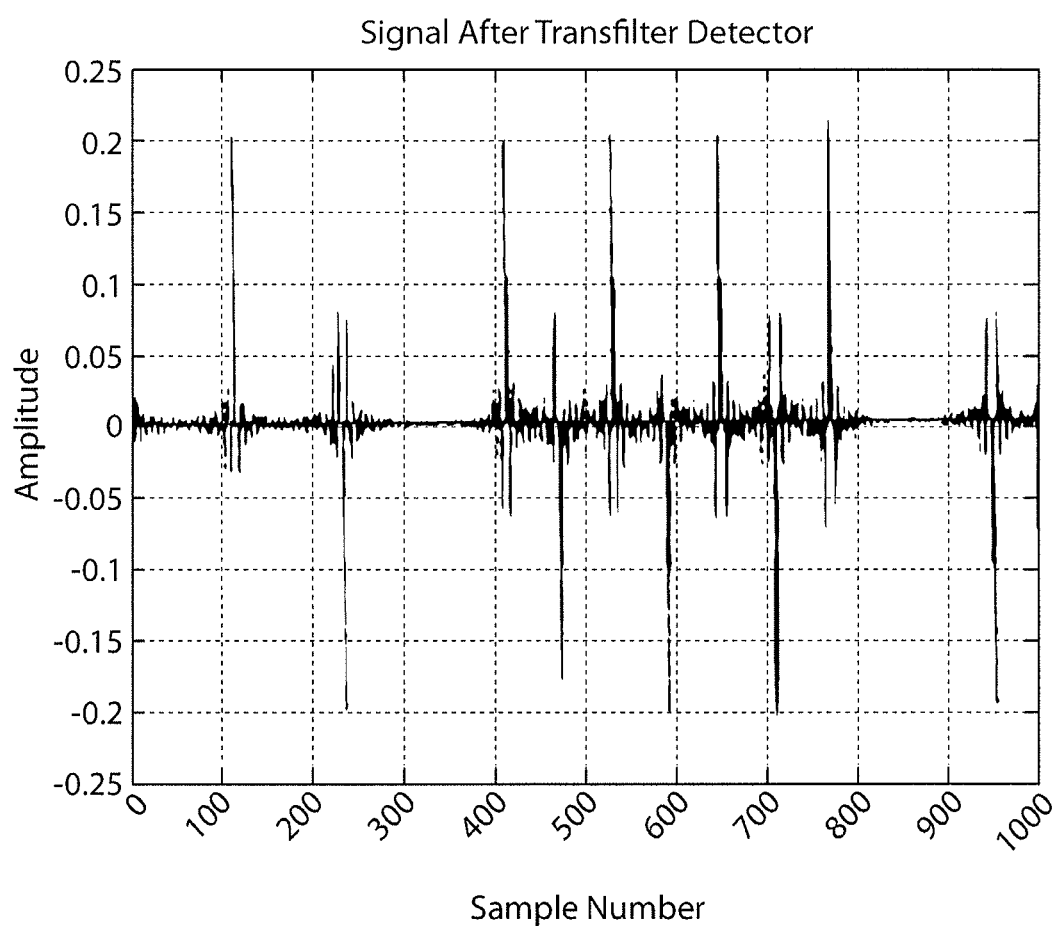
FIG. 29A-29B are output signal and the output noise, respectively of the digital trans-filter.
Figure 29B:
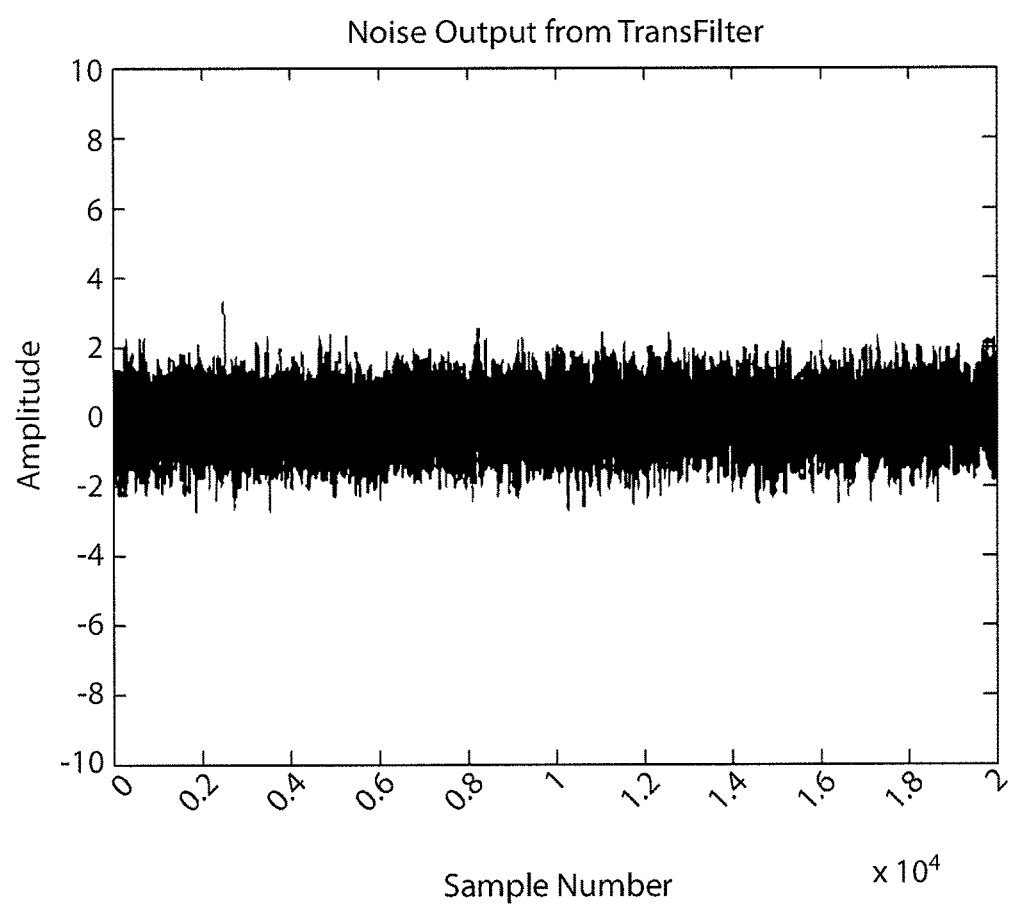

When the output of the two arms are added together at the summing network 127 of the DTF 120, the noise completely cancels at the center of the band and is reduced throughout the band; however, the signal deviation remains the same, resulting in increased SNR. The DTF's 120 spectral response is shown in FIG. 26. FIG. 27 is the phase response of the DTF 120. FIGS. 28A-28B depict the signal input and the noise input, respectively, to the DTF 120. FIGS. 29A-29B depict the signal output and the noise output, respectively at the DTF 120. In particular, FIGS. 28A-29A depict separate processing of noise and an FSK signal with a random bitstream message and carrier frequencies 0.2 and 0.3 times $F_S$. For best performance, these are arranged symmetrically around the trans-filter 120 null. Since the trans-filter 120 is completely linear, it is valid to look at the noise and signal components separately. It can be seen that the noise level is reduced. The signal is seen to be demodulated, where each transition in the carrier frequency results in an impulse, positive for a transition from lower to higher frequency, and negative for a transition from higher to lower frequency. As previously described, the trans-filter 120 converts wideband exponential signals, in this case (by way of example only), FSK, into a set of positive and negative impulses. An output filter is used after the trans-filters 120 to remove non-impulsive energy. Since impulses have a white spectrum, this involves removing all narrowband energy prior to identifying the positive and negative impulses. This filtering step increases output SNR and removes the FM carrier frequency or frequencies.

As with the trans-filter 20, the DTF 120 can be cascaded with other DTFs 120 to increase noise compression and enhance impulse amplitudes for detection of the exponentially modulated signal.

It should be further understood that the trans-filter 20 may also act as a pre-stage for an analog-to-digital (A/D) converter in a reconfigurable receiver to compress the noise in the analog input signal prior to the A/D conversion process. For example, as also shown in FIG. 30, the trans-filter 20 can compress in-band noise before the analog signal is digitized (e.g., an A/D converter). The digitized signal is then inputted into a cascade of DTFs 120. In particular, the trans-filter 20 may be used in cases where the SNR would be adversely affected by the digitizer's quantizing noise. After digitization, one or more DTFs allow detection at improved SNR. It should be further noted that the first DTF 120 in the cascade detects the signal, whether analog or digital. As discussed previously also, in some circumstances the output signal of the final DTF 120 of the cascade can be further filtered (e.g., the low pass filter 16 as shown in FIG. 5).

In view of the foregoing, the key features of the trans-filter 20/120 for digitally-modulated signals are:

(1) compresses noise in the signal band;
(2) generates impulses at data transitions for any modulation format;
(3) can be cascaded with other trans-filters 20/120 to increase noise compression and impulse amplitude;
(4) demodulates carrier regenerating transitions of data stream;
(5) experiences a latency equal to one bit period; and
(6) requires no precision oscillators or timing.

While the invention has been described in detail and with reference to specific examples thereof, it will be apparent to one skilled in the art that various changes and modifications can be made therein without departing from the spirit and scope thereof.

What is claimed is:

1. A filter that demodulates an exponentially modulated signal and compresses noise in its signal band, said filter comprising:

a first frequency selective network and a second frequency selective network using only linear components and which form a frequency domain derivative operator that generate an output that is a function of a rate of change of a carrier frequency of the exponentially modulated signal at an input to said filter, said linear components minimizing a threshold that is normally present in exponentially modulated signal demodulators;

said first frequency selective network tuned above a center frequency of the exponentially modulated signal and said second frequency selective network tuned below the center frequency of the exponentially modulated signal, said first frequency selective network and said second frequency selective network being configured in parallel and both receiving the exponentially modulated signal as a first input signal, said first frequency selective network generating a first output signal and said second frequency selective network generating a second output signal, and wherein said first output signal and said second output signal are 180 degrees out of phase; and a summing network for receiving said first and second output signals and summing said first and second output signals to generate impulses for abrupt changes in the carrier frequency corresponding to data transitions that form the baseband of said exponentially modulated signal; and wherein said filter is operative on any modulation format of said exponentially modulated signal and generates said impulses while compressing noise in the signal band.

2. The filter of claim 1 wherein a phase of said first output signal comprises +90 degrees and a phase of said second output signal comprises −90 degrees.

3. A method for demodulating an exponentially modulated signal and compressing noise in its signal band, said method comprising:

feeding the exponentially modulated signal into a filter comprising first and second frequency selective networks that use only linear components for minimizing a threshold that is normally present in exponentially modulated signal demodulators, said first frequency selective network being tuned above a center frequency of the exponentially modulated signal and said second frequency selective network being tuned below the center frequency of the exponentially modulated signal, said first frequency selective network and said second frequency selective network being configured in parallel and both receiving the exponentially modulated signal as a first input signal, said first frequency selective network generating a first output signal and said second frequency selective network generating a second output signal, and wherein said first output signal and said second output signal are 180 degrees out of phase;

summing said first and second output signals to generate impulses for abrupt changes in the carrier frequency corresponding to data transitions that form the baseband of said exponentially modulated signal, said impulses corresponding to a frequency domain derivative of said exponentially modulated signal which is a function of a rate of change of the carrier frequency of the exponentially modulated signal, independent of a modulation format used in said exponentially modulated signal; and compressing noise in said signal band.

4. The method of claim 3 further comprising the steps of:

feeding said impulses into at least a second filter comprising a third frequency selective network and a fourth frequency selective network both of which also use only linear components for also minimizing a threshold that is normally present in exponentially modulated signal demodulators, said third frequency selective network being tuned above the center frequency of the exponentially modulated signal and said fourth frequency selective network being tuned below the center frequency of the exponentially modulated signal, said third frequency selective network and said fourth frequency selective network also being configured in parallel and each generating third and fourth outputs, respectively, that are also 180 degrees out of phase; and summing said third and fourth output signals to generate a second derivative of said impulses while further compressing noise in the signal band and further increasing amplitudes of said impulses.

5. The method of claim 3 wherein said step of feeding the exponentially modulated signal into said filter comprises forming said first output to have a phase of +90 degrees while forming said second output to have a phase of −90 degrees.

6. The method of claim 4 wherein said step of feeding said impulses into a second filter comprises forming said third output to have a phase of +90 degrees while forming said fourth output to have a phase of −90 degrees.

7. A system, formed of at least two filters, that demodulates an exponentially modulated signal and compresses noise in its signal band, said system comprising:
   a first filter comprising:
      a first frequency selective network and a second frequency selective network using only linear components and which form a frequency domain derivative operator that generates an output that is a function of a rate of change of a carrier frequency of the exponentially modulated signal at an input to said first filter, said linear components minimizing a threshold that is normally present in exponentially modulated signal demodulators;
      said first frequency selective network tuned above a center frequency of the exponentially modulated signal and said second frequency selective network tuned below the center frequency of the exponentially modulated signal, said first frequency selective network and said second frequency selective network being configured in parallel and both receiving the exponentially modulated signal as a first input signal, said first frequency selective network generating a first output signal and said second frequency selective network generating a second output signal, and wherein said first output signal and said second output signal are 180 degrees out of phase; and
      a first summing network for receiving said first and second output signals and summing said first and second output signals to generate impulses for abrupt changes in the carrier frequency corresponding to data transitions that form the baseband of said exponentially modulated signal; and
      wherein said filter is operative on any modulation format of said exponentially modulated signal and generates said impulses while compressing noise in the signal band; and
   a second filter comprising:
      a third frequency selective network and a fourth frequency selective network using only linear components and which also form a frequency domain derivative operator that receive said impulses from said first filter and obtains a second derivative of said impulses, said second filter further compressing noise in the signal band and further increasing amplitudes of said impulses; and
      said third frequency selective network tuned above the center frequency of the exponentially modulated signal and said fourth frequency selective network tuned below the center frequency of the exponentially modulated signal, said third frequency selective network and said fourth frequency selective network also being configured in parallel and each having outputs that are also 180 degrees out of phase and which are fed to a second summing network for generating a second derivative of said impulses.

8. The system of claim 7 wherein a phase of said first output signal comprises +90 degrees and wherein a phase of said second output signal comprises −90 degrees.

9. The system of claim 7 wherein said third output signal comprises +90 degrees and wherein a phase of said fourth output signal comprises −90 degrees.

\* \* \* \* \*